(12) United States Patent
Oh et al.

(10) Patent No.: US 11,901,321 B2
(45) Date of Patent: Feb. 13, 2024

(54) THREE-DIMENSIONAL (3D) STORAGE DEVICE USING WAFER-TO-WAFER BONDING

(71) Applicant: Samsung Electronics Co., Ltd., Suwon-si (KR)

(72) Inventors: Eun Chu Oh, Hwaseong-si (KR); Junyeong Seok, Seoul (KR); Younggul Song, Hwaseong-si (KR); Byungchul Jang, Suwon-si (KR); Joonsung Lim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 34 days.

(21) Appl. No.: 17/854,287

(22) Filed: Jun. 30, 2022

(65) Prior Publication Data

US 2023/0060469 A1 Mar. 2, 2023

(30) Foreign Application Priority Data

Aug. 25, 2021 (KR) ........................ 10-2021-0112469

(51) Int. Cl.
*H01L 23/00* (2006.01)
*H01L 25/065* (2023.01)
(Continued)

(52) U.S. Cl.
CPC .......... *H01L 24/08* (2013.01); *G06F 11/1008* (2013.01); *G06F 11/1048* (2013.01);
(Continued)

(58) Field of Classification Search
CPC ..... H01L 24/08; H01L 25/0657; H01L 25/18; H01L 25/50; H01L 2224/0603;
(Continued)

(56) References Cited

U.S. PATENT DOCUMENTS 10,651,153 B2 * 5/2020 Fastow ............... H01L 25/0652
10,748,886 B2 8/2020 Park et al.
(Continued)

FOREIGN PATENT DOCUMENTS

KR 10-2021-0037629 A 4/2021
WO WO-2020-220280 A1 11/2020

OTHER PUBLICATIONS

Shen et al., Monolithic 3D Chip Integrated with 500ns NVM, 3ps Logic Circuits and SRAM, 20, 2013, IEEE, pp. 1-4. (Year: 2013).*

*Primary Examiner* — John J Tabone, Jr.
(74) *Attorney, Agent, or Firm* — Harness, Dickey & Pierce, P.L.C.

(57) ABSTRACT

A three-dimensional (3D) storage device using wafer-to-wafer bonding is disclosed. In the storage device, a first chip including a peripheral circuit region including a first control logic circuit configured to control operation modes of a nonvolatile memory (NVM) device is wafer-bonded with a second chip including 3D arrays of NVM cells, and a memory controller includes a third chip including a control circuit region. The control circuit region of the third chip includes a second control logic circuit associated with operation conditions of the NVM device, and the second control logic circuit includes a serializer/deserializer (SERDES) interface configured to share random access memory (RAM) in the memory controller and transmit and receive data to and from the NVM device.

20 Claims, 12 Drawing Sheets

(51) Int. Cl.
*H01L 25/18* (2023.01)
*G06F 11/10* (2006.01)
*H01L 25/00* (2006.01)
*G11C 7/10* (2006.01)
*H10B 41/20* (2023.01)
*H10B 41/40* (2023.01)
*H10B 41/50* (2023.01)
*H10B 43/20* (2023.01)
*H10B 43/40* (2023.01)
*H10B 43/50* (2023.01)

(52) U.S. Cl.
CPC ............ *G11C 7/10* (2013.01); *H01L 25/0657* (2013.01); *H01L 25/18* (2013.01); *H01L 25/50* (2013.01); *H10B 41/20* (2023.02); *H10B 41/40* (2023.02); *H10B 41/50* (2023.02); *H10B 43/20* (2023.02); *H10B 43/40* (2023.02); *H10B 43/50* (2023.02); *H01L 2224/0603* (2013.01); *H01L 2224/08145* (2013.01); *H01L 2225/06524* (2013.01); *H01L 2225/06541* (2013.01); *H01L 2924/1431* (2013.01); *H01L 2924/14511* (2013.01)

(58) Field of Classification Search
CPC . H01L 2224/08145; H01L 2225/06524; H01L 2225/06541; H01L 2924/1431; H01L 2924/14511; G06F 11/1008; G06F 11/1048; G11C 7/10; H10B 41/20; H10B 41/40; H10B 41/50; H10B 43/20; H10B 43/40; H10B 43/50
USPC .......... 714/773; 711/104, 114, 170; 365/200, 365/201, 208, 220, 221, 218
See application file for complete search history.

(56) References Cited

U.S. PATENT DOCUMENTS

| | | | |
|---|---|---|---|
| 10,892,269 | B2 | 1/2021 | Fukuzumi et al. |
| 11,348,901 | B1* | 5/2022 | Hou ........................ H01L 24/32 |
| 2019/0273090 | A1 | 9/2019 | Fukuzumi et al. |
| 2020/0243486 | A1* | 7/2020 | Quader ............... H01L 25/0657 |
| 2020/0350014 | A1* | 11/2020 | Liu ..................... G11C 14/0018 |
| 2020/0350286 | A1* | 11/2020 | Cheng .................... H10B 12/31 |
| 2020/0350287 | A1* | 11/2020 | Liu ........................ H10B 43/35 |
| 2021/0066320 | A1 | 3/2021 | Kim et al. |
| 2021/0111089 | A1 | 4/2021 | Liu |
| 2021/0217716 | A1* | 7/2021 | Wu ........................ H10B 41/40 |
| 2021/0233900 | A1* | 7/2021 | Kim ....................... H01L 23/481 |
| 2023/0060469 | A1* | 3/2023 | Oh ....................... G06F 11/1008 |

* cited by examiner

THREE-DIMENSIONAL (3D) STORAGE DEVICE USING WAFER-TO-WAFER BONDING

CROSS-REFERENCE TO RELATED APPLICATION

This application is based on and claims priority under 35 U.S.C. § 119 to Korean Patent Application No. 10-2021-0112469, filed on Aug. 25, 2021, in the Korean Intellectual Property Office, the disclosure of which is incorporated by reference herein in its entirety.

BACKGROUND

The inventive concepts relate to semiconductor devices, and more particularly, to three-dimensional (3D) storage devices using wafer-to-wafer-bonding.

A system using semiconductor chips widely uses dynamic random access memory (DRAM) as a working memory or a main memory of the system and uses a storage device as a storage medium, to store data or instructions to be used by a host in the system and/or perform a computational operation. The storage device includes a nonvolatile memory (NVM). Along with an increase in a capacity of a storage device, the numbers of memory cells and word lines stacked on a substrate of an NVM have increased, and the number of bits of data stored in a memory cell has also increased. To improve a storage capacity and a degree of integration of a memory, an NVM device having memory cells stacked in a 3D structure, e.g., a 3D NAND flash memory, has been researched. A storage device capable of stably and quickly performing real-time processing on bulk data by using a 3D NAND flash memory also has been researched.

SUMMARY

The inventive concepts provide three-dimensional (3D) storage devices using wafer-to-wafer-bonding.

According to some example embodiments of the inventive concepts, a storage device includes a nonvolatile memory (NVM) device including NVM cells; and a memory controller configured to control the NVM device. The NVM device includes a first chip including a peripheral circuit region including a first control logic circuit configured to control operation modes of the NVM device, the peripheral circuit region being on a first surface of a first substrate of the first chip; and a second chip including 3D arrays of the NVM cells, the 3D arrays being on a first surface of a second substrate of the second chip, and the second chip is vertically stacked on the first chip so that the first surface of the first substrate is bonded with the first surface of the second substrate. The memory controller includes a third chip including a control circuit region including circuits configured to set and change operation conditions of the NVM, the control circuit region being on a first surface of a third substrate of the third chip, and a second control logic circuit associated with the operation conditions of the NVM device being on the first surface of the third substrate of the third chip.

According to some example embodiments of the inventive concepts, a storage device includes a plurality of NVM devices each including NVM cells; and a memory controller configured to control the plurality of NVM devices. Each of the plurality of NVM devices includes a first chip including a peripheral circuit region including a first control logic circuit configured to control operation modes of a corresponding NVM device, the peripheral circuit region being on a first surface of a first substrate of the first chip; and a second chip including 3D arrays of the NVM cells, the 3D arrays are on a first surface of a second substrate of the second chip, and the second chip is vertically stacked on the first chip so that the first surface of the first substrate is bonded with the first surface of the second substrate. The memory controller includes a third chip including a control circuit region including circuits configured to set and change operation conditions of each of the plurality of NVM devices, the control circuit region being on a first surface of a third substrate of the third chip, the control circuit region includes a serializer/deserializer (SERDES) interface configured to transmit and receive data to and from the plurality of NVM devices, and a second control logic circuit associated with the operation conditions of each of the plurality of NVM devices being on the first surface of the third substrate of the third chip.

According to some example embodiments of the inventive concepts, a storage device includes an NVM device including NVM cells; and a memory controller configured to control the NVM device. The NVM device includes a first chip including a peripheral circuit region including a control logic circuit configured to control operation modes of the NVM device, and a control circuit region including a memory management unit (MMU) included in the memory controller and configured to set and change operation conditions of the NVM, the peripheral circuit region and the control circuit region are on a first surface of a first substrate of the first chip; and a second chip including 3D arrays of the NVM cells, the 3D arrays are on a first surface of a second substrate of the second chip, and the second chip is vertically stacked on the first chip so that the first surface of the first substrate is bonded with the first surface of the second substrate. The control logic circuit is adjacent to the MMU and is connected to the MMU.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
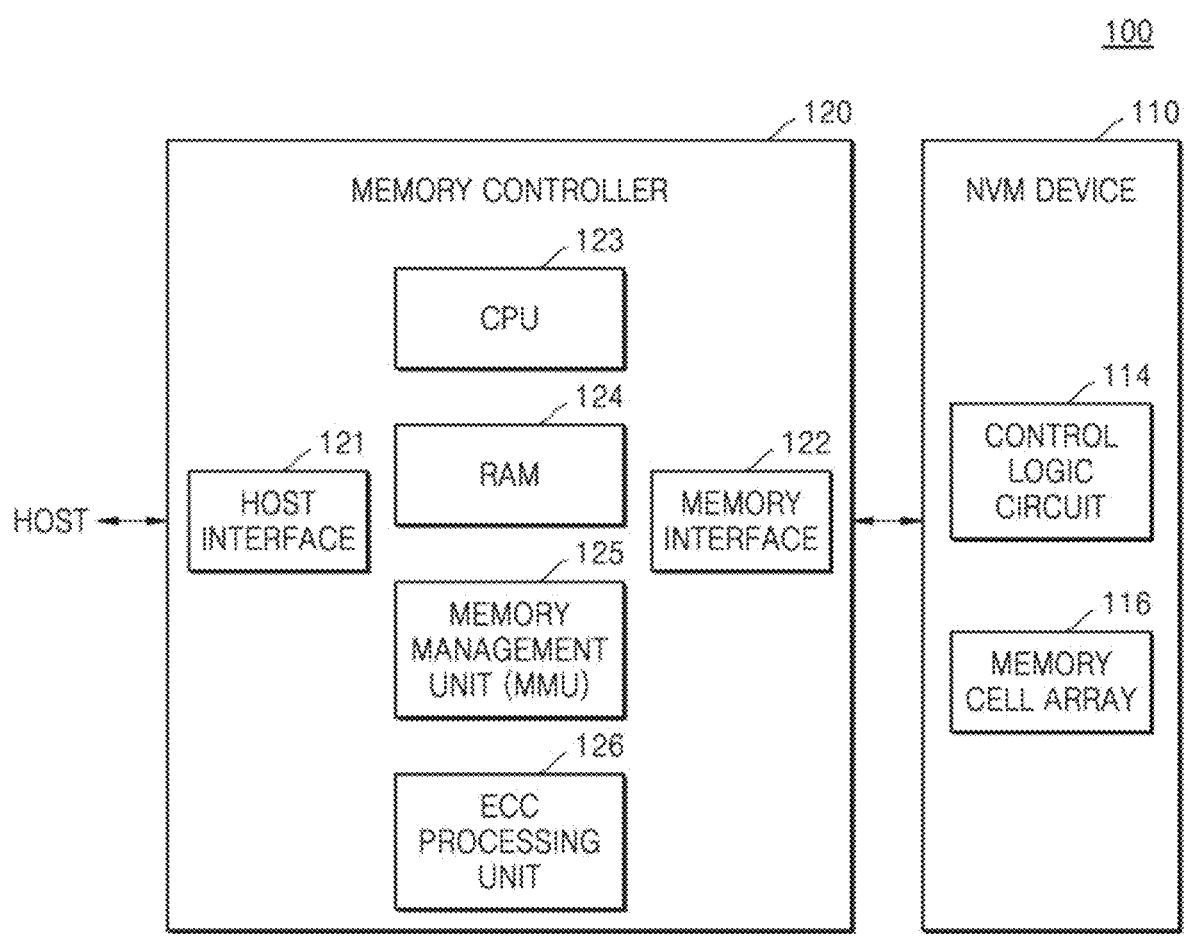
FIG. 1 is a block diagram illustrating a storage device according to some example embodiments of the inventive concept.

FIG. 1 is a block diagram illustrating a storage device 100 according to some example embodiments of the inventive concepts.

Referring to FIG. 1, the storage device 100 may include a memory device 110 and a memory controller 120. In some example embodiments, a plurality of conceptual hardware configurations included in the storage device 100 are shown, but the example embodiments are not limited thereto, and other configurations are also possible. The memory controller 120 may control the memory device 110 to write data in the memory device 110, in response to a write request from a host, or control the memory device 110 to read data stored in the memory device 110, in response to a read request from the host.

In some example embodiments, the storage device 100 may be an internal memory embedded in an electronic device. For example, the storage device 100 may be a universal flash storage (UFS) memory device, an embedded multi-media card (eMMC), or a solid state drive (SSD). In some example embodiments, the storage device 100 may be an external memory detachably attachable to an electronic device. For example, the storage device 100 may include at least one of a UFS memory card, a compact flash (CF) card, a secure digital (SD) card, a micro secure digital (Micro-SD) card, a mini secure digital (Mini-SD) card, an extreme digital (xD) card, and a memory stick.

The memory device 110 may perform a write operation or a read operation under control of the memory controller 120. The memory device 110 may receive a command and an address from the memory controller 120 through input/output lines and transmit and receive data for a write operation or a read operation to and from the memory controller 120. In addition, the memory device 110 may receive control signals through control lines. The memory device 110 may include a control logic circuit 114 and a memory cell array 116.

The control logic circuit 114 may generally control various kinds of operations of the memory device 110. The control logic circuit 114 may receive a command/an address from the memory controller 120 and generate, according to the received command/address, control signals for controlling components of the memory device 110. For example, by using the control signals, the control logic circuit 114 may store data in the memory cell array 116 or read data stored in the memory cell array 116 and output the read data to the memory controller 120.

The memory cell array 116 may include a plurality of memory cells. For example, the plurality of memory cells may be flash memory cells. However, the inventive concepts are not limited thereto, and the plurality of memory cells may be resistive random access memory (RRAM) cells, ferroelectric random access memory (FRAM) cells, phase change random access memory (PRAM) cells, thyristor random access memory (TRAM) cells, or magnetic random access memory (MRAM) cells. Hereinafter, example embodiments of the inventive concepts are described based on some example embodiments in which memory cells are NAND flash memory cells. Accordingly, the memory device 110 may be referred as a nonvolatile memory (NVM) device and hereinafter referred to as so.

The memory cell array 116 may include a plurality of memory blocks BLK1 to BLKz (z is an integer greater than or equal to 2) (see FIG. 2), and each of the plurality of memory blocks BLK1 to BLKz may include a plurality of pages. The memory cell array 116 may include a three-dimensional (3D) memory cell array including a plurality of cell strings and is described in detail with reference to FIGS. 3 and 4.

The memory controller 120 may include a host interface 121, a memory interface 122, a central processing unit (CPU) 123, RAM 124, a memory management unit (MMU) 125, and an error correction code (ECC) processing unit 126.

The host interface 121 receives a request for a memory operation from the host by interfacing with the host. For example, the host interface 121 receives various kinds of requests such as data read and write from the host and generates various kinds of internal signals for a memory operation on the NVM device 110 in response to the received various kinds of requests. For example, the host interface 121 may be configured to communicate with the host through at least one of various interface protocols such as an advanced technology attachment (ATA) interface protocol, a serial ATA (SATA) interface protocol, an external SATA (e-SATA) interface protocol, a small computer small interface (SCSI) protocol, a serial attached SCSI (SAS) protocol, a peripheral component interconnection (PCI) interface protocol, a PCI express (PCI-E) interface protocol, an Institute of Electrical and Electronics Engineers (IEEE) 1394 interface protocol, a universal serial bus (USB) interface protocol, an SD card interface protocol, a multi-media card (MMC) interface protocol, an embedded MMC (eMMC) interface protocol, and a CF card interface protocol.

The memory interface 122 may provide an interface between the memory controller 120 and the NVM device 110, and for example, write data and read data may be transmitted and received to and from the NVM device 110 through the memory interface 122. In addition, the memory interface 122 may provide a command and an address to the NVM device 110, and receive various kinds of information from the NVM device 110 and provide the received various kinds of information to the inside of the memory controller 120.

The CPU 123 may be configured to control a general operation of the memory controller 120, and the RAM 124 may be used as a working memory. The CPU 123 may control the general operation of the memory controller 120 by executing firmware loaded in the RAM 124. The RAM 124 may be implemented by various kinds of memories, e.g., implemented by at least one of a cache memory, DRAM, static RAM (SRAM), PRAM, and flash memory devices. Hereinafter, the inventive concepts are described based on some example embodiments in which the RAM 124 is SRAM and hereinafter referred to as so.

The CPU 123 may be configured to operate firmware such as a flash translation layer (FTL) stored in the MMU 125. The MMU 125 may store various kinds of code executable by the CPU 123 to control or manage the performance and reliability of the NVM device 110. The FTL may be used to manage mapping information indicating a relationship between a logic address from the host and a physical address in the NVM device 110. However, a role of the FTL is not limited to that disclosed herein. For example, the FTL may be used to perform wear-leveling management, bad block management, data retention management caused by unpredictable power cutoff, and the like of the NVM device 110.

The MMU 125 may include an artificial neural network model storing program code for inferring operation conditions for accessing each of the plurality of memory blocks BLK1 to BLKz, based on a deterioration state of the NVM device 110, to support various functions of the FTL. The NVM device 110 is deteriorated due to various causes according to a use pattern of a user, a use environment, and the like. The MMU 125 may store deterioration information of the NVM device 110. The deterioration information may include a program/erase (P/E) cycle, an erase count, a program count, a read count, a wear-level count, an elapse time, an operation temperature, and the like. The MMU 125 may include a fuse circuit or registers storing the deterioration information of the NVM device 110.

The MMU 125 may overcome the deterioration by changing the operation conditions of the NVM device 110 by using the artificial neural network model. The operation conditions to be changed may be set in advance in the storage device 100 based on an average use pattern and use environment. The MMU 125 may change the operation conditions according to a degree of deterioration by monitoring a deterioration state of the NVM device 110 while using the storage device 100. The MMU 125 may be a deep learning machine specified to execute or train the artificial neural network model.

For example, the MMU 125 may generate, based on the deterioration information, training data including optimal, improved, or desired, read levels VR1 to VR15 or VR1' to VR15' (see FIG. 5) to be applied to respective word lines of the plurality of memory blocks BLK1 to BLKz of the NVM device 110 and store the generated training data in the SRAM 124. The CPU 123 may correct weights and biases of the artificial neural network model based on the training data. The weights and the biases of the artificial neural network model may be corrected according to various deterioration conditions, e.g., retention times, the numbers of reads, or various combinations of the retention times and the numbers of reads. The artificial neural network model may repeat receiving input data of training data and outputting the optimal, improved, or desired, read levels VR1 to VR15 or VR1' to VR15'. Thereafter, the storage device 100 may read data by applying the optimal, improved, or desired, read levels VR1 to VR15 or VR1' to VR15' to a target word line of the NVM device 110 corresponding to a request from the host.

The ECC processing unit 126 may perform ECC encoding and decoding processing on data requested to be written in the NVM device 110 and data read from the NVM device 110, and accordingly, detect and correct an error of the data. The ECC processing unit 126 may generate ECC for correcting fail bits or error bits of data transmitted/received to/from the NVM device 110. The ECC processing unit 126 may form parity bit-added write data by performing error correction encoding on write data provided from the NVM device 110. The parity bit may be stored in the NVM device 110. In addition, the ECC processing unit 126 may perform error correction decoding on read data output from the NVM device 110. The ECC processing unit 126 may acquire error-corrected ECC data by using a parity bit for read data read by a read operation. The ECC processing unit 126 may correct an error by using a low density parity check (LDPC) code, a Bose-Chaudhuri-Hocquenghem (BCH) code, a turbo code, a Reed-Solomon code, a convolution code, a recursive systematic code (RSC), or coded modulation such as trellis-coded modulation (TCM) or block coded modulation (BCM).

Figure 2:
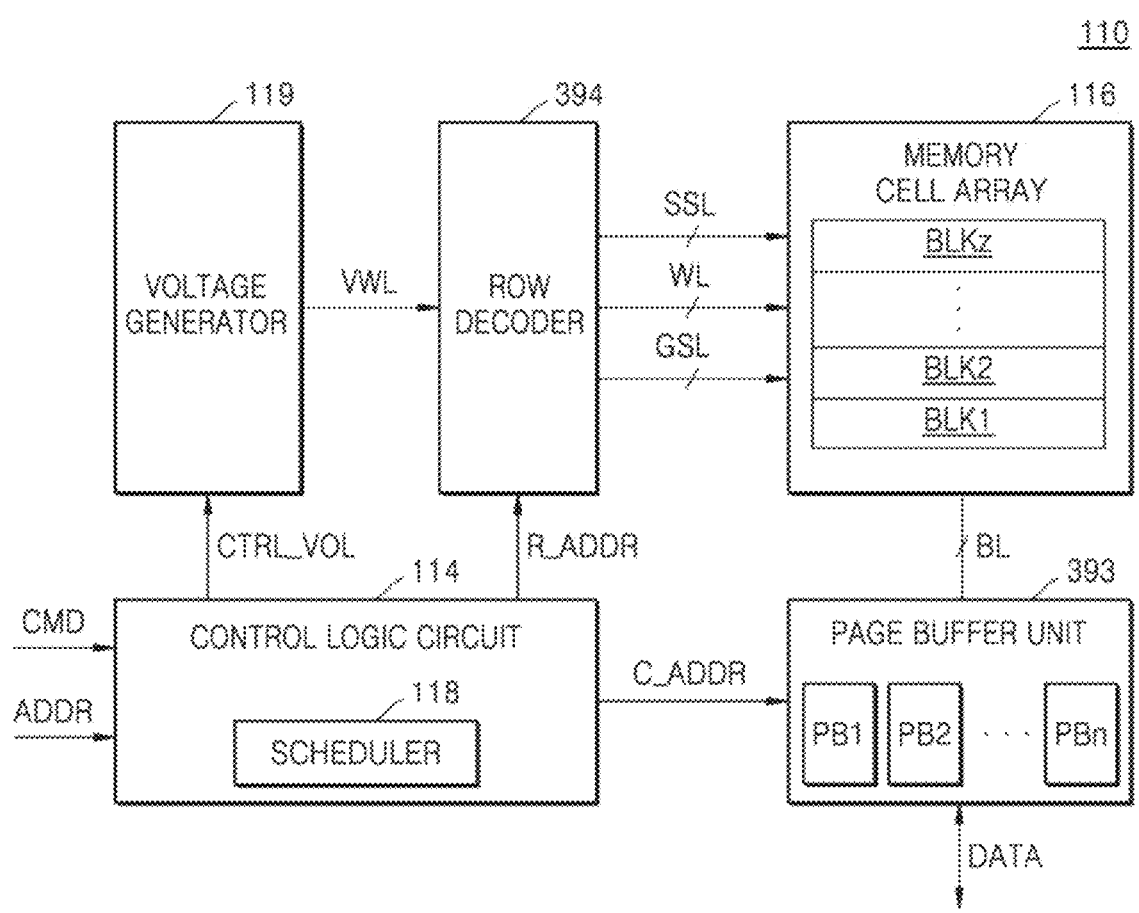
FIG. 2 is a block diagram illustrating a nonvolatile memory (NVM) device of FIG. 1.

FIG. 2 is a block diagram illustrating the NVM device 110 of FIG. 1.

Referring to FIGS. 1 and 2, the NVM device 110 may include the control logic circuit 114, the memory cell array 116, a voltage generator 119, a page buffer unit 393, and a row decoder 394. Although not shown in FIG. 2, the NVM device 110 may further include a command decoder, an address decoder, an input/output circuit, and the like.

The control logic circuit 114 may generally control various kinds of operation modes of the NVM device 110. The control logic circuit 114 may receive a command CMD and/or an address ADDR from the memory controller 120. The control logic circuit 114 may output various kinds of internal control signals for performing program, read, and erase operations on the memory cell array 116, based on the received command/address CMD/ADDR. The control logic circuit 114 may provide a row address R_ADDR to the row decoder 394, provide a column address C_ADDR to the page buffer unit 393, and provide a voltage control signal CTRL_VOL to the voltage generator 119. In addition, the control logic circuit 114 may include a scheduler 118 configured to control a voltage level, an application time point, an application time, and/or the number of application times of corresponding control signals according to an operation mode of the NVM device 110. The scheduler 118 may set operation parameters and/or data to be used to control characteristics of the NVM device 110. The scheduler 118 may be implemented by a micro controller unit (MCU).

The memory cell array 116 may include the plurality of memory blocks BLK1 to BLKz, and each of the plurality of memory blocks BLK1 to BLKz may include a plurality of memory cells. The memory cell array 116 may be connected to the page buffer unit 393 through bit lines BL and connected to the row decoder 394 through word lines WL, string select lines SSL, and ground select lines GSL.

In some example embodiments, the memory cell array 116 may include a 3D memory cell array, and the 3D memory cell array may include a plurality of memory NAND strings. Each memory NAND string may include memory cells respectively connected to word lines vertically stacked on a substrate. U.S. Pat. Nos. 7,679,133, 8,553,466, 8,654,587, and 8,559,235 and US Patent Application No. 2011/0233648, herein incorporated in their entirety by reference, are cited in the specification.

The page buffer unit 393 may include a plurality of page buffers PB1 to PBn (n is an integer greater than or equal to 2), and the plurality of page buffers PB1 to PBn may be connected to memory cells through a plurality of bit lines BL, respectively. The page buffer unit 393 may select at least one bit line BL from among the plurality of bit lines BL in response to the column address C-ADDR. The page buffer unit 393 may operate as a write driver or a sense amplifier according to an operation mode. For example, in a program operation, the page buffer unit 393 may apply, to a selected bit line BL, a bit line voltage corresponding to data to be programmed. In a read operation, the page buffer unit 393 may sense data stored in a memory cell by sensing a current or a voltage of a selected bit line BL.

The voltage generator 119 may generate various types of voltages for performing program, read, and erase operations, based on the voltage control signal CTRL_VOL. For example, the voltage generator 119 may generate a program voltage, a read voltage, a program verify voltage, an erase voltage, or the like as a word line voltage VWL.

The row decoder 394 may select one of a plurality of word lines WL and one of a plurality of string select lines SSL in response to the row address R_ADDR. For example, in a program operation, the row decoder 394 may apply the program voltage and the program verify voltage to a selected word line WL, and in a read operation, the row decoder 394 may apply the read voltage to a selected word line WL.

According to an operation mode of the NVM device 110, a voltage level, an application time point, an application time, the number of application times, and/or the like associated with the program voltage, the program verify voltage, and/or the read voltage for a selected word line WL, the erase voltage for a selected block, the bit line voltage for a selected bit line BL, and the like may be controlled by the scheduler 118. The scheduler 118 may control operational characteristics of the NVM device 110 by interworking with the MMU 125 in the memory controller 120.

Figure 3:
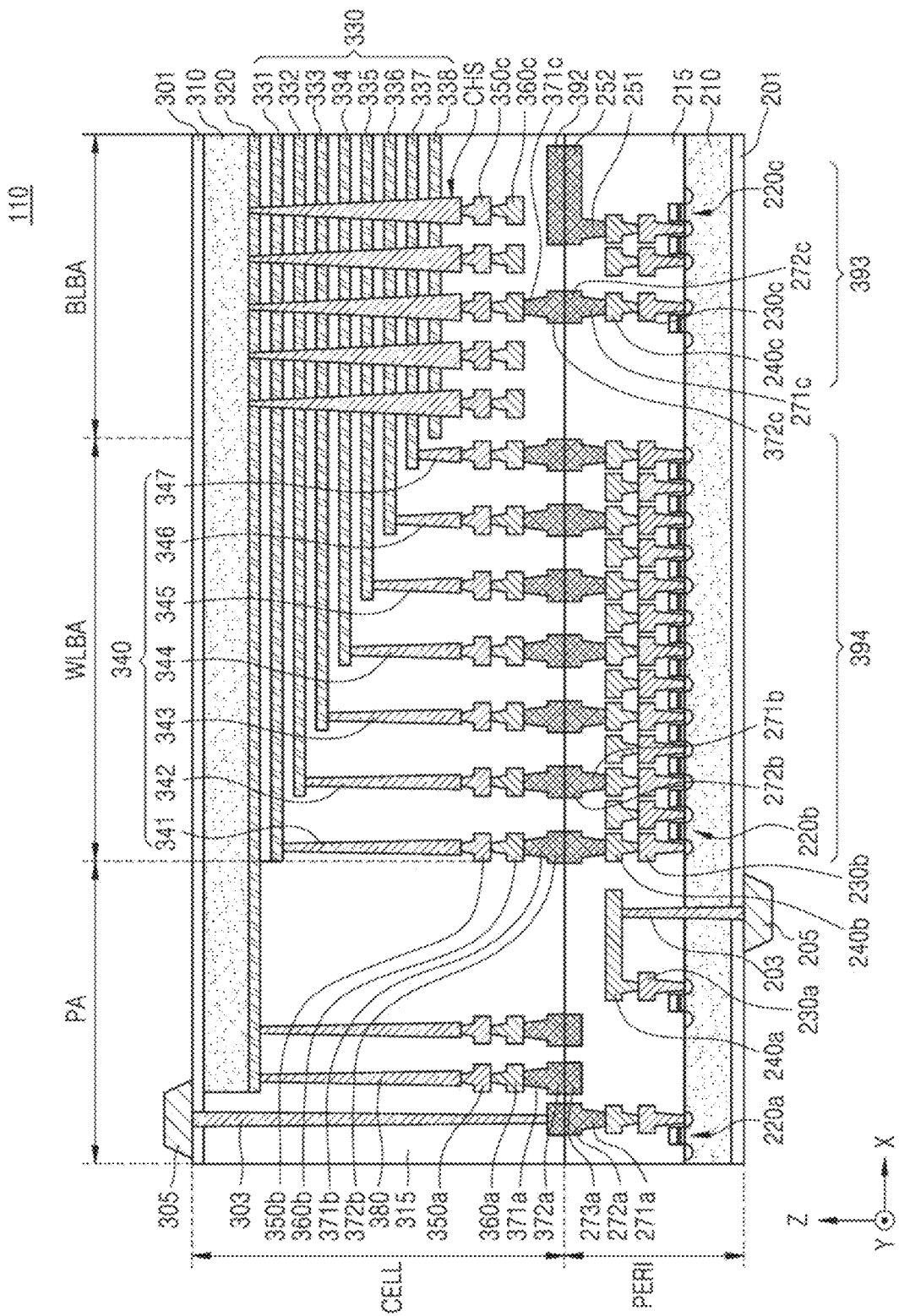
FIG. 3 is a diagram illustrating a structure of the NVM device of FIG. 2.

FIG. 3 is a diagram illustrating a memory device 110 of FIG. 2 according to some example embodiments.

Referring to FIG. 3, the memory device 110 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip to a bonding metal formed on an uppermost metal layer of the lower chip. For example, the bonding metals may include copper (Cu) using Cu-to-Cu bonding. However, example embodiments of the inventive concepts are not limited thereto. For example, the bonding metals may also be formed of aluminum (Al) or tungsten (W).

Each of the peripheral circuit region PERI and the cell region CELL of the memory device 141 may include an external pad bonding area PA, a word line bonding area WLBA, and a bit line bonding area BLBA.

The peripheral circuit region PERI may include a first substrate 210, an interlayer insulating layer 215, a plurality of circuit elements 220*a*, 220*b*, and 220*c* formed on the first substrate 210, first metal layers 230*a*, 230*b*, and 230*c* respectively connected to the plurality of circuit elements 220*a*, 220*b*, and 220*c*, and second metal layers 240*a*, 240*b*, and 240*c* respectively formed on the first metal layers 230*a*, 230*b*, and 230*c*. In some example embodiments, the first metal layers 230*a*, 230*b*, and 230*c* may be formed of tungsten having relatively high electrical resistivity, and the second metal layers 240*a*, 240*b*, and 240*c* may be formed of copper having relatively low electrical resistivity.

In some of the example embodiments illustrated in FIG. 3, although only the first metal layers 230*a*, 230*b*, and 230*c* and the second metal layers 240*a*, 240*b*, and 240*c* are shown and described, example embodiments of the inventive concepts are not limited thereto. For example, one or more additional metal layers may be further formed on the second metal layers 240*a*, 240*b*, and 240*c*. At least a portion of the one or more additional metal layers formed on the second metal layers 240*a*, 240*b*, and 240*c* may be formed of aluminum or another metal having a lower electrical resistivity than those of copper forming the second metal layers 240*a*, 240*b*, and 240*c*.

The interlayer insulating layer 215 may be disposed on the first substrate 210 and cover the plurality of circuit elements 220*a*, 220*b*, and 220*c*, the first metal layers 230*a*, 230*b*, and 230*c*, and the second metal layers 240*a*, 240*b*, and 240*c*. The interlayer insulating layer 215 may include an insulating material such as silicon oxide or silicon nitride.

Lower bonding metals 271*b* and 272*b* may be formed on the second metal layer 240*b* in the word line bonding area WLBA. In the word line bonding area WLBA, the lower bonding metals 271*b* and 272*b* in the peripheral circuit region PERI may be electrically bonded to upper bonding metals 371*b* and 372*b* of the cell region CELL. The lower bonding metals 271*b* and 272*b* and the upper bonding metals 371*b* and 372*b* may be formed of aluminum, copper, or tungsten. Further, the upper bonding metals 371*b* and 372*b* in the cell region CELL may be referred as first metal pads and the lower bonding metals 271*b* and 272*b* in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (e.g., 330) may be stacked in a direction (a Z-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction (a Z-axis direction), perpendicular to the upper surface of the second substrate 310, and pass through the plurality of word lines 330, the at least one string select line, and the at least one ground select line. The channel structure CH may include a data storage layer, a channel layer, and a buried insulating layer, and the channel layer may be electrically connected to a first metal layer 350*c* and a second metal layer 360*c*. For example, the first metal layer 350*c* may be a bit line contact, and the second metal layer 360*c* may be a bit line, and may be referred to as such hereafter. In some example embodiments, the bit line 360*c* may extend in a first direction (a Y-axis direction), parallel to the upper surface of the second substrate 310.

In some of the example embodiments illustrated in FIG. 3, an area in which the channel structure CH and the bit line 360*c* are disposed may be defined as the bit line bonding area BLBA. In the bit line bonding area BLBA, the bit line 360*c* may be electrically connected to the circuit elements 220*c* including a page buffer 393 in the peripheral circuit region PERI. The bit line 360*c* may be connected to upper bonding metals 371*c* and 372*c* in the cell region CELL, and the upper bonding metals 371*c* and 372*c* may be connected to lower bonding metals 271*c* and 272*c* connected to the circuit elements 220*c* of the page buffer 393.

In the word line bonding area WLBA, the plurality of word lines 330 may extend in a second direction (an X-axis direction), parallel to the upper surface of the second substrate 310 and perpendicular to the first direction, and may be connected to a plurality of cell contact plugs 341 to 347 (e.g., 340). The plurality of word lines 330 and the plurality of cell contact plugs 340 may be connected to each other in pads provided by at least a portion of the plurality of word lines 330 extending at different lengths in the second direction. A first metal layer 350*b* and a second metal layer 360*b* may be connected to an upper portion of the plurality of cell contact plugs 340 connected to the plurality of word lines 330, sequentially. The plurality of cell contact plugs 340 may be connected to the peripheral circuit region PERI by the upper bonding metals 371*b* and 372*b* of the cell region CELL and the lower bonding metals 271b and 272b of the peripheral circuit region PERI in the word line bonding area WLBA.

The plurality of cell contact plugs 340 may be electrically connected to the circuit elements 220b forming a row decoder 394 in the peripheral circuit region PERI. In some example embodiments, operating voltages of the circuit elements 220b of the row decoder 394 are different than operating voltages of the circuit elements 220c forming the page buffer 393. For example, operating voltages of the circuit elements 220c forming the page buffer 393 may be greater than operating voltages of the circuit elements 220b forming the row decoder 394.

A common source line contact plug 380 may be disposed in the external pad bonding area PA. The common source line contact plug 380 may be formed of a conductive material such as a metal, a metal compound, or polysilicon, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

First and second input-output pads 205 and 305 may be disposed in the external pad bonding area PA. Referring to FIG. 3, a lower insulating film 201 covering a lower surface of the first substrate 210 may be formed below the first substrate 210, and the first input-output pad 205 may be formed on the lower insulating film 201. The first input-output pad 205 may be connected to at least one of the plurality of circuit elements 220a, 220b, and 220c disposed in the peripheral circuit region PERI through a first input-output contact plug 203, and may be separated from the first substrate 210 by the lower insulating film 201. In addition, a side insulating film may be disposed between the first input-output contact plug 203 and the first substrate 210 to electrically separate the first input-output contact plug 203 and the first substrate 210.

Referring to FIG. 3, an upper insulating film 301 covering the upper surface of the second substrate 310 may be formed on the second substrate 310, and the second input-output pad 305 may be disposed on the upper insulating layer 301. The second input-output pad 305 may be connected to at least one of the plurality of circuit elements 220a, 220b, and 220c disposed in the peripheral circuit region PERI through a second input-output contact plug 303. In some example embodiments, the second input-output pad 305 is electrically connected to the circuit element 220a.

According to some example embodiments, the second substrate 310 and the common source line 320 are not disposed in an area in which the second input-output contact plug 303 is disposed. Also, the second input-output pad 305 does not overlap the word lines 330 in the third direction (the Z-axis direction). Referring to FIG. 3, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to some example embodiments, the first input-output pad 205 and the second input-output pad 305 are selectively formed. For example, the memory device 141 may include only the first input-output pad 205 disposed on the first substrate 210 or the second input-output pad 305 disposed on the second substrate 310. Alternatively, the memory device 141 may include both the first input-output pad 205 and the second input-output pad 305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 141 may include a lower metal pattern 273a corresponding to an upper metal pattern 372a formed in an uppermost metal layer of the cell region CELL, and having the same cross-sectional shape as the upper metal pattern 372a of the cell region CELL so as to be connected to each other, in an uppermost metal layer of the peripheral circuit region PERI. In the peripheral circuit region PERI, in some example embodiments, the lower metal pattern 273a formed in the uppermost metal layer of the peripheral circuit region PERI is not connected to a contact. Similarly, in the external pad bonding area PA, the upper metal pattern 372a, corresponding to the lower metal pattern 273a formed in an uppermost metal layer of the peripheral circuit region PERI, and having the same shape as the lower metal pattern 273a of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by Cu-to-Cu bonding.

Further, in the bit line bonding area BLBA, an upper metal pattern 392, corresponding to a lower metal pattern 252 formed in the uppermost metal layer of the peripheral circuit region PERI, and having the same cross-sectional shape as the lower metal pattern 252 of the peripheral circuit region PERI, may be formed in an uppermost metal layer of the cell region CELL. In some example embodiments, a contact is not formed on the upper metal pattern 392 formed in the uppermost metal layer of the cell region CELL.

In some example embodiments, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. In some example embodiments, a contact is not formed on the reinforcement metal pattern.

Figure 4:
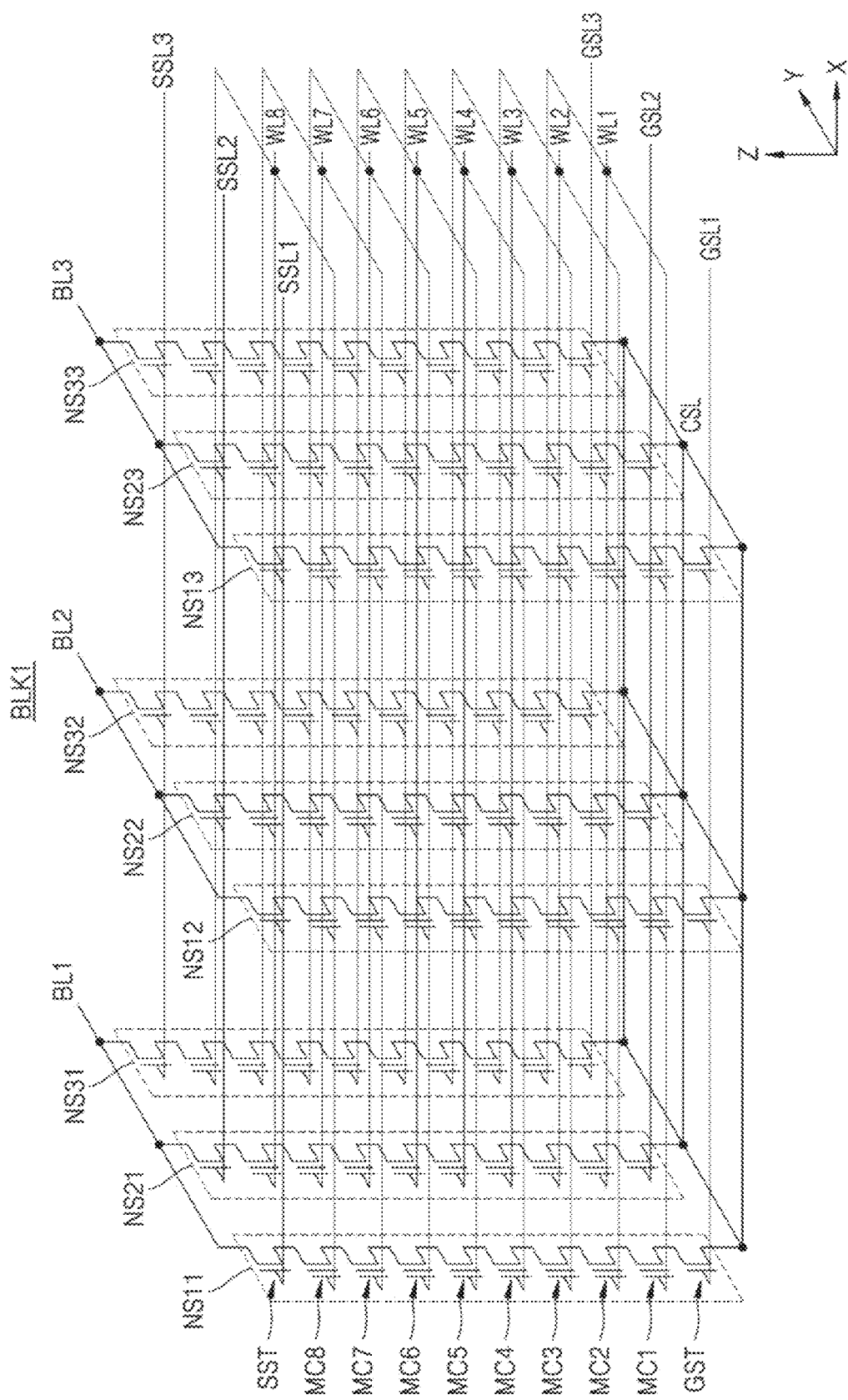
FIG. 4 is an equivalent circuit diagram of a memory block of FIG. 2.

FIG. 4 is an equivalent circuit diagram of a memory block of FIG. 2. The memory block shown in FIG. 4 is an example of one of the plurality of memory blocks BLK1 to BLKz described with reference to FIG. 2, and FIG. 4 shows a first memory block BLK1. Hereinafter, example embodiments of the inventive concepts are described in detail based on the first memory block BLK1. The first memory block BLK1 indicates a 3D memory block formed in a 3D structure on a substrate. A plurality of memory cell strings included in the first memory block BLK1 may be formed in a direction z vertical to the substrate.

Referring to FIG. 4, the first memory block BLK1 may include cell strings NS11 to NS33, word lines WL1 to WL8, bit lines BL1 to BL3, ground select lines GSL1 to GSL3, string select lines SSL1 to SSL3, and a common source line CSL. Although FIG. 4 shows that each of the cell strings NS11 to NS33 includes eight memory cells MC1 to MC8 respectively connected to eight word lines WL1 to WL8, the inventive concepts are not limited thereto.

Each cell string (e.g., NS11) may include a string select transistor SST, the memory cells MC1 to MC8, and a ground select transistor GST, which are connected in series. The string select transistor SST is connected to a corresponding string select line SSL1. The memory cells MC1 to MC8 are connected to corresponding word lines WL1 to WL8, respectively. The ground select transistor GST is connected to a corresponding ground select line GSL1. The string select transistor SST is connected to a corresponding bit line BL1, BL2, or BL3, and the ground select transistor GST is connected to the common source line CSL.

According to some example embodiments, in each cell string, one or more dummy memory cells may be provided between a string select transistor SST and the memory cells MC1 to MC8. In each cell string, one or more dummy memory cells may be provided between a ground select transistor GST and the memory cells MC1 to MC8. In each cell string, one or more dummy memory cells may be provided between the memory cells MC1 to MC8. The dummy memory cells have the same structure as the memory cells MC1 to MC8 and may not be programmed (e.g., program-prohibited) or may be programmed to be different from the memory cells MC1 to MC8. For example, when the memory cells MC1 to MC8 are programmed to have two or more threshold voltage distributions, the dummy memory cells may be programmed to have one threshold voltage distribution range or a number of threshold voltage distributions less than the memory cells MC1 to MC8.

Figure 5:
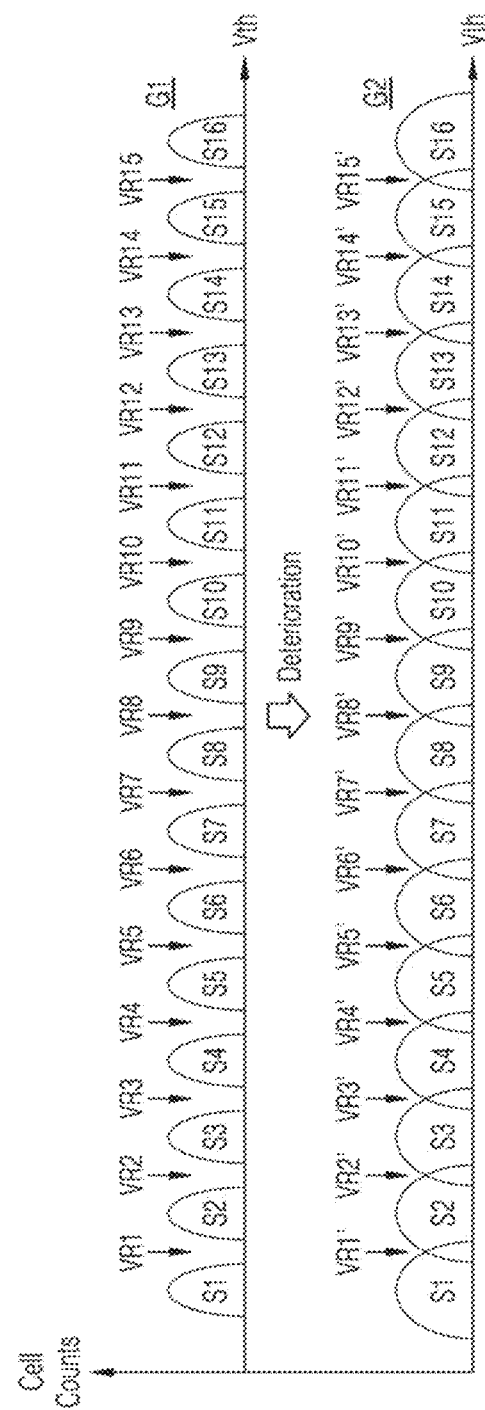
FIG. 5 shows graphs illustrating a shift of a threshold voltage distribution of memory cells of FIG. 4.
Figure 6:
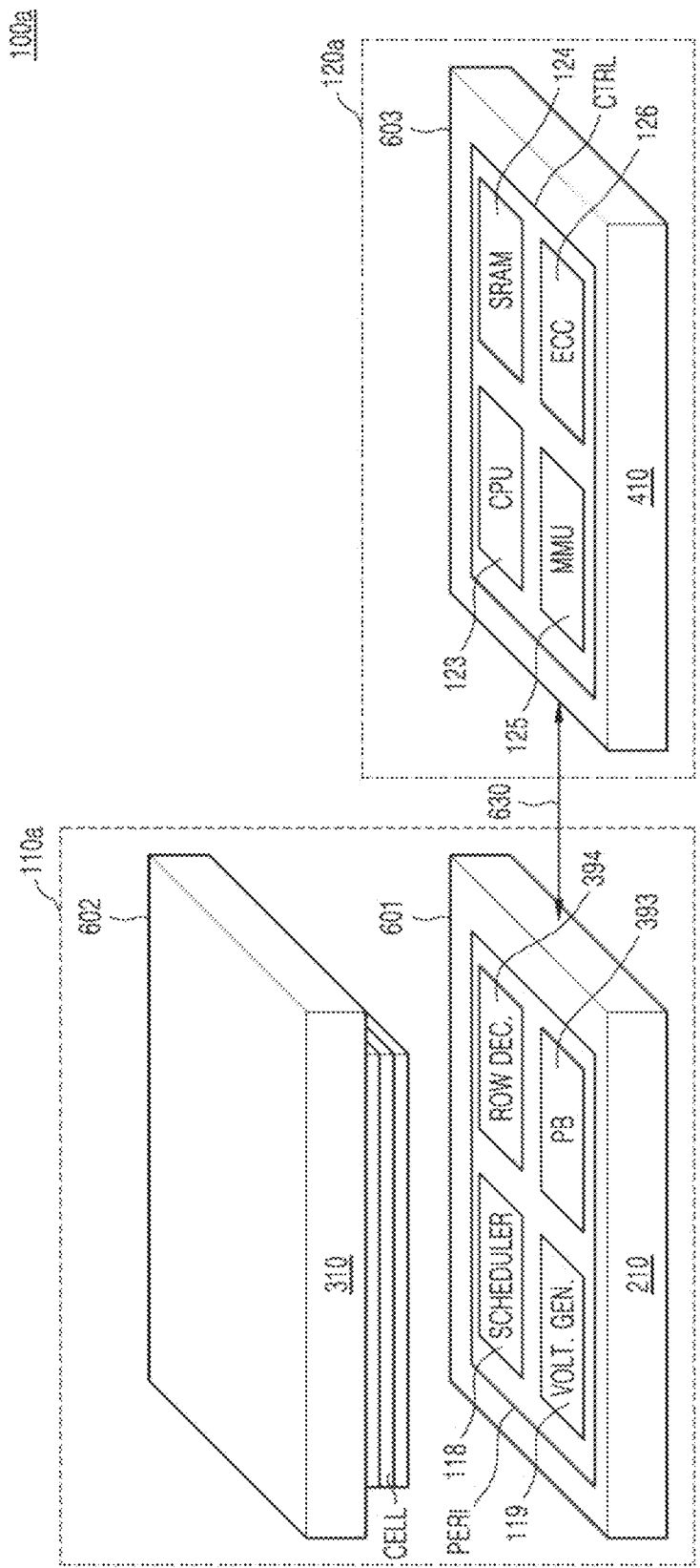
FIG. 6 illustrates some example embodiments in which the storage device of FIG. 1 is implemented by three-dimensional (3D) wafer-to-wafer bonding.

FIG. 5 shows graphs G1 and G2 illustrating a shift of a threshold voltage distribution of memory cells MC of FIG. 4. In FIG. 5, each of the graphs G1 and G2 shows a distribution of threshold voltages of memory cells MC connected to a certain word line, e.g., a first word line, in the first memory block BLK1. The horizontal axis indicates threshold voltages of the memory cells MC, and the vertical axis indicates cell counts, e.g., the number of memory cells MC.

Referring to FIG. 5, one or more bits may be programmed in a memory cell connected to the first word line. According to the number of bits stored in the memory cell, the memory cell may be classified into a single-level cell (SLC), a multi-level cell (MLC), a triple-level cell (TLC), or a quadruple-level cell (QLC). The memory cell may have a plurality of states according to the numbers of bits stored in the memory cell. The plurality of states may be defined by ranges of a threshold voltage. In FIG. 5, the memory cell may be a QLC, and a threshold voltage of the memory cell may be programmed to one of 16 states S1 to S16.

To program data in the memory cell, a plurality of program loops may be performed until programming is completed according to incremental step pulse programming (ISPP). As program loops increase, a program voltage of a selected memory cell may increase step by step. To decrease program disturb, a program operation may have a program order in which memory cells located at the top of a cell string are first programmed. Before program loops for the selected memory cell, an initialization or pre-charge operation may be performed on channels of a plurality of cell strings. However, if memory cells located at the top of a cell string are in a programmed state, some channels corresponding to the programmed memory cells may be negatively boosted, and the cell string may be initialized with incomplete channels due to a high threshold voltage of the programmed memory cells. Program disturb and/or hot carrier injection due to the incomplete channel initialization significantly affects the memory cells in the cell string.

To overcome these problems, the scheduler 118 in the NVM device 110 may control program operation conditions by interworking with the MMU 125 in the memory controller 120. For example, a program operation on a selected memory cell may be performed by controlling program operation conditions associated with setting voltage levels of a program voltage and/or a verify read voltage to be applied to a selected word line and pre-charge voltages to be applied to a bit line and/or a source line, setting a voltage application time point, an application time, and/or the number of application times, setting a single memory block to be divided into word line units so as to be managed as a plurality of sub-blocks, and the like.

After data is programmed in the memory cell, disturb deterioration or retention deterioration may occur in the memory cell. The disturb deterioration indicates a phenomenon that threshold voltages of memory cells are changed due to program, read, erase, coupling, or the like occurring in the surroundings of the memory cells. The retention deterioration indicates a phenomenon that threshold voltages of memory cells are changed because trapped charges are leaked according to time after charges are trapped in a charge trap layer of a memory cell to program the memory cell. If deterioration occurs in a memory cell, a threshold voltage of the memory cell changes, and thus, if initially set read levels are used, data of the memory cell may not be read (e.g., a data loss). The data loss results in a decrease in reliability of the storage device 100 (see FIG. 1) and the NVM device 110.

In FIG. 5, when memory cells have a distribution of threshold voltages as shown in graph G1, optimal, improved, or desired, read levels for reading data stored in the memory cells may be VR1 to VR15. Due to deterioration, graph G1 may be changed or shifted to graph G2. When memory cells have a distribution of threshold voltages as shown in graph G2, optimal, improved, or desired, read levels for reading data stored in the memory cells may be changed from VR1 to VR15 to VR1' to VR15'.

The scheduler 118 in the NVM device 110 may control read operation conditions in a read operation by interworking with the MMU 125 in the memory controller 120. That is, to perform a read operation on the selected memory cell connected to the first word line with the changed read levels VR1' to VR15', a target read level and a target develop time point may be adjusted, and a read operation on the selected memory cell may be performed by using the adjusted target read level and target develop time point.

FIG. illustrates some example embodiments in which the storage device 100 of FIG. 1 is implemented by 3D wafer-to-wafer bonding. Hereinafter, a suffix attached to a reference numeral (e.g., a in 100a orb in 100b) is used to identify a plurality of circuits having the same function.

Referring to FIGS. 1 to 3 and 6, in a storage device 100a, an NVM device 110a may include a first chip 601 including the peripheral circuit region PERI formed on the first substrate 210 and a second chip 602 including the cell region CELL formed on the second substrate 310. The NVM device 110a is implemented by wafer bonding in which the second chip 602 is turned over and faces the first chip 601, and as shown in FIG. 3, the upper bonding metals 372a, 372b, and 372c in the cell region CELL are electrically connected to the lower bonding metals 272a, 272b, and 272c in the peripheral circuit region PERI of the first chip 601. In the peripheral circuit region PERI of the first chip 601, the scheduler 118, the voltage generator 119, the page buffer unit 393, and the row decoder 394 may be arranged. For convenience of description, it is described that the scheduler 118 in the control logic circuit 114 is arranged in the peripheral circuit region PERI, but the other circuits in the control logic circuit 114 are also arranged in the peripheral circuit region PERI.

A memory controller 120a is implemented by a third chip 603 including a control circuit region CTRL formed on a third substrate 410. In the control circuit region CTRL, the CPU 123, the SRAM 124, the MMU 125, and the ECC processing unit 126 may be formed. The first chip 601, the second chip 602, and the third chip 603 may be manufactured by different processes.

After wafer-bonding of the first chip 601 and the second chip 602, the first and second input-output pads 205 and 305 in the external pad bonding area PA, which are formed on rear surfaces of the first substrate 210 and the second substrate 310, may be electrically connected to the memory controller 120a through conductive wire(s) 630. For briefness of a drawing, one conductive wire 630 corresponds to signals (e.g., a chip enable signal nCE, a command latch enable signal CLE, an address latch enable signal ALE, a write enable signal nWE, a plurality of data signals DQ carrying a command, an address, and data thereon, a read enable signal nRE, and a data strobe signal DQS) transmitted and received between the NVM device 110a and the memory controller 120a and may actually include a plurality of conductive wires.

Figure 7:
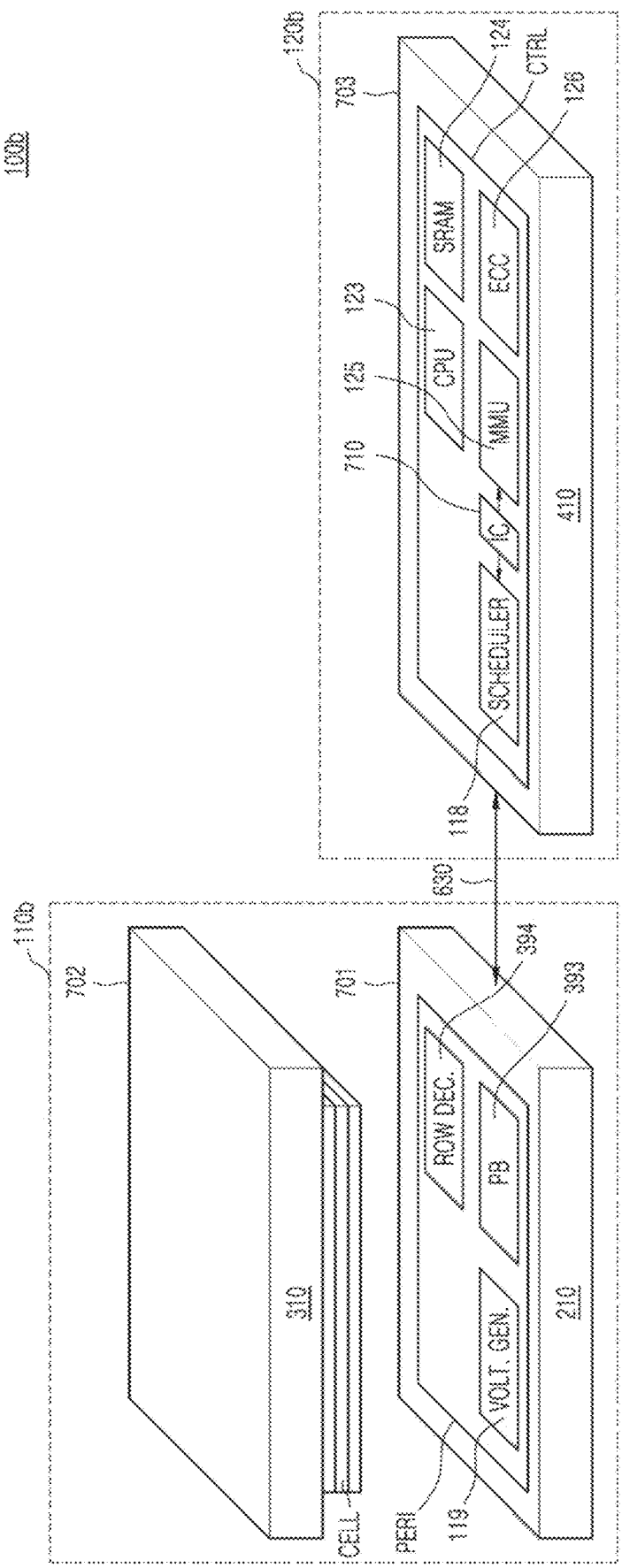
FIG. 7 illustrates some example embodiments in which the storage device of FIG. 1 is implemented by 3D wafer-to-wafer bonding.

FIG. 7 illustrates some example embodiments in which the storage device 100 of FIG. 1 is implemented by 3D wafer-to-wafer bonding. Compared with the storage device 100a of FIG. 6, a storage device 100b of FIG. 7 differs in that the scheduler 118 is arranged in the control circuit region CTRL of a third chip 703. Hereinafter, a description is made based on differences from FIG. 6.

Referring to FIGS. 1 to 3 and 7, an NVM device 110b may include a first chip 701 including the peripheral circuit region PERI formed on the first substrate 210 and a second chip 702 including the cell region CELL formed on the second substrate 310. In the peripheral circuit region PERI of the first chip 701, the voltage generator 119, the page buffer unit 393, and the row decoder 394 may be arranged. In the control circuit region CTRL of the third chip 703, the CPU 123, the SRAM 124, the MMU 125, the ECC processing unit 126, and the scheduler 118 may be arranged.

The scheduler 118 may control an operation of the NVM device 110b based on code stored in the MMU 125. The scheduler 118 may control an operation of the NVM device 110b by setting program operation conditions, read operation conditions, and/or erase operation conditions in association with the various kinds of code, the deterioration information, the artificial neural network model, and the like stored in the MMU 125 of the memory controller 120b. The scheduler 118 may store, in the SRAM 124, set or changed operation conditions of the NVM device 110b when the operation conditions of the NVM device 110b are set or changed. The scheduler 118 may store, in the SRAM 124, operation parameters and/or data to be used to control characteristics of the NVM device 110b. That is, the scheduler 118 is configured to share the SRAM 124 in the memory controller 120b and may set or change the operation conditions of the NVM device 110b by using the SRAM 124.

In the third chip 703, the scheduler 118 may be arranged to be adjacent to the MMU 125. The various kinds of code for controlling or managing the performance and reliability of the NVM device 110b, which are stored in the MMU 125, may be quickly provided to the scheduler 118 arranged to be adjacent to the MMU 125. According to some example embodiments, the scheduler 118 may be connected to the MMU 125 via an interconnector circuit 710. According to some example embodiments, the scheduler 118 may be directly connected to the MMU 125 without the interconnector circuit 710. Accordingly, high-speed operation performance of the storage device 100b may be improved by the scheduler 118 coupled to the MMU 125.

Figure 8:
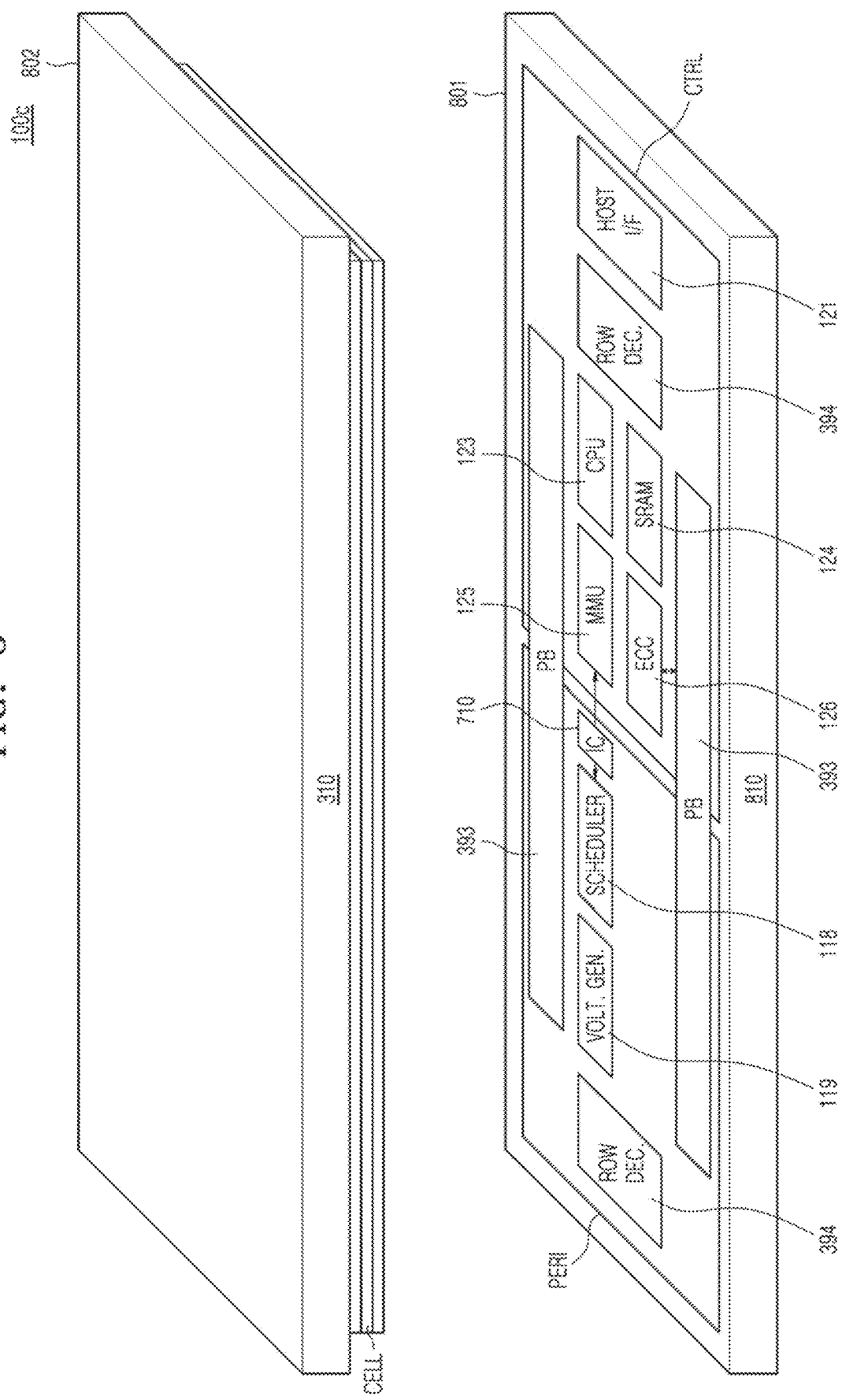
FIG. 8 illustrates some example embodiments in which the storage device of FIG. 1 is implemented by 3D wafer-to-wafer bonding.

FIG. 8 illustrates some example embodiments in which the storage device 100 of FIG. 1 is implemented by 3D wafer-to-wafer bonding. Compared with the storage device 100a of FIG. 6, a storage device 100c of FIG. 8 differs in that the peripheral circuit region PERI of an NVM device and the control circuit region CTRL of a memory controller are formed in a single chip.

Referring to FIGS. 1 to 3 and 8, the storage device 100c may include a first chip 801 including the peripheral circuit region PERI and the control circuit region CTRL formed on a first substrate 810, and a second chip 802 including the cell region CELL formed on the second substrate 310. The first chip 801 and the second chip 802 face each other and are implemented by wafer bonding in which bonding metals are electrically connected. In the storage device 100c, the memory controller 120 and the NVM device 110 may be directly connected without the conductive wire 630 described with reference to FIG. 6. Accordingly, the storage device 100c does not have to separately include the memory interface 122 and thus has a small area. In addition, the storage device 100c is not affected by a signal line environment such as interference distortion, reflective noise, and/or crosstalk which the conductive wire 630 causes, and thus, high-speed operation performance of the storage device 100c may be improved.

In the first chip 801, the peripheral circuit region PERI of the NVM device 110 and the control circuit region CTRL of the memory controller 120 may be formed on the first substrate 810. The page buffer unit 393 and the row decoder 394 in the peripheral circuit region PERI may be arranged in edge areas of the first substrate 810. The page buffer unit 393 may be arranged in edge areas of the first substrate 810 in a first direction, and the row decoder 394 may be arranged in edge areas of the first substrate 810 in a second direction that is orthogonal to the first direction. The scheduler 118 and the voltage generator 119 in the peripheral circuit region PERI and the CPU 123, the SRAM 124, the MMU 125, and the ECC processing unit 126 in the control circuit region CTRL may be arranged at an inner side of the edge areas of the first substrate 810 in which the page buffer unit 393 and the row decoder 394 are arranged. The host interface 121 in the control circuit region CTRL may be arranged at an outer side of the edge areas of the first substrate 810 in which the page buffer unit 393 and the row decoder 394 are arranged.

In the first chip 801, the scheduler 118 in the peripheral circuit region PERI may be arranged to be adjacent to the MMU 125 in the control circuit region CTRL. The various kinds of code for controlling or managing the performance and reliability of the NVM device 110, which are stored in the MMU 125, may be quickly provided to the scheduler 118 arranged to be adjacent to the MMU 125.

In the first chip 801, the page buffer unit 393 in the peripheral circuit region PERI may be arranged to be adjacent to the ECC processing unit 126 in the control circuit region CTRL. Data transmitted and received through the page buffer unit 393 may be quickly provided to the ECC processing unit 126. The ECC processing unit 126 may relatively quickly correct error bits of data transmitted and received through the page buffer unit 393, and thus, the high-speed operation performance of the storage device 100c may be improved.

Figure 9:
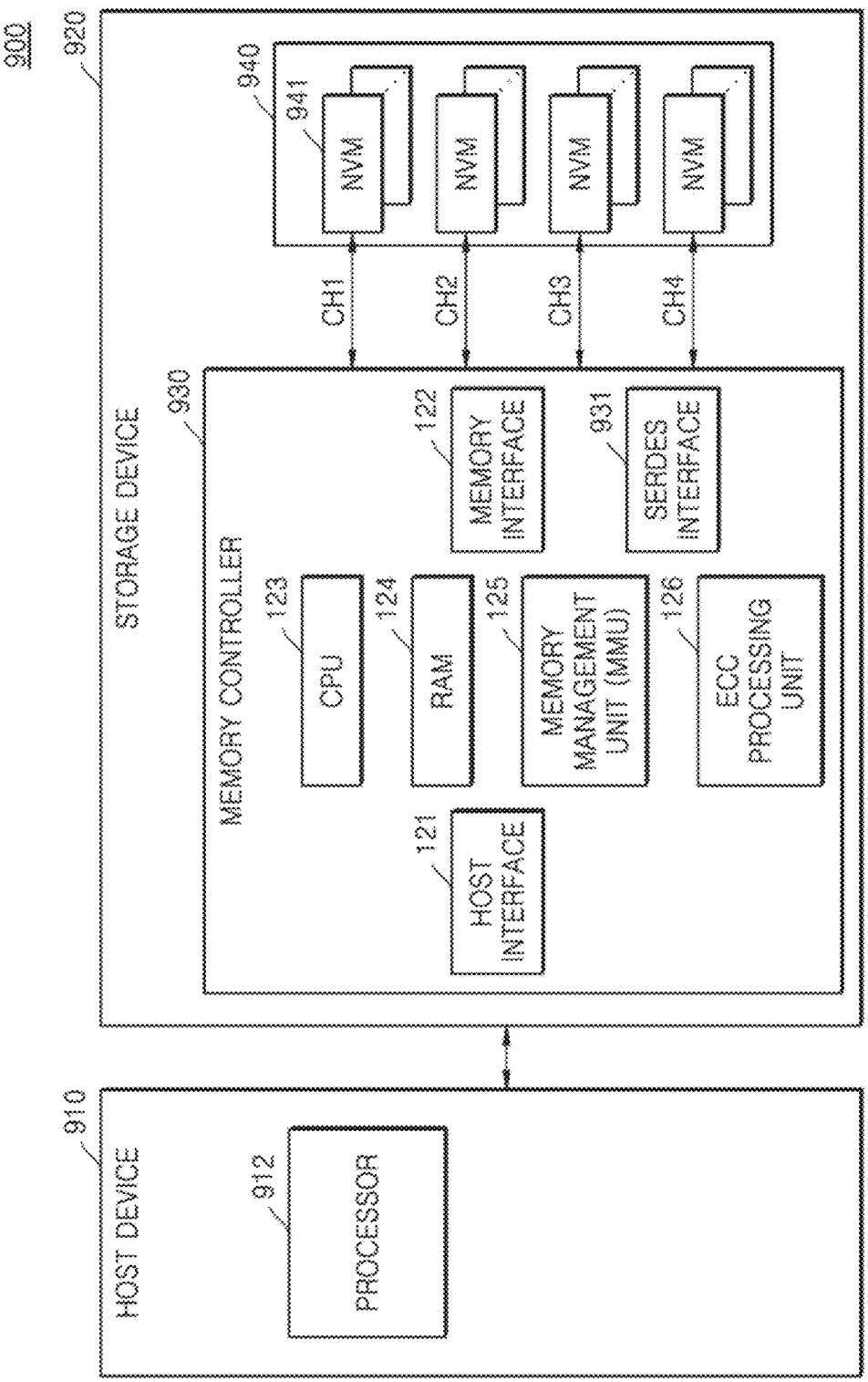
FIG. 9 is a block diagram conceptually describing a system according to some example embodiments of the inventive concept.

FIG. 9 is a block diagram conceptually describing a system 900 according to some example embodiments of the inventive concepts.

Referring to FIG. 9, the system 900 may be a data center including tens of host machines or servers configured to execute hundreds of virtual machines. According to some example embodiments, the system 900 may be, for example, a computing device such as a laptop computer, a desktop computer, a server computer, a workstation, a portable communication terminal, a personal digital assistant (PDA), a portable multimedia player (PMP), a smartphone, a tablet personal computer (PC), or other appropriate computer, a virtual machine, or a virtual computing device of the virtual machine. Alternatively, the system 900 may be some of components included in a computing system such as a graphics card.

The system 900 includes a plurality of hardware configurations to be more particularly described below with reference to FIG. 9 but is not limited thereto, and other configurations are also possible. The system 900 may include a host device 910 and a storage device 920. The host device 910 may control a data processing operation, e.g., a data read operation, a data write operation, or the like, on the storage device 920. The host device 910 may indicate a data processing device capable of processing data, such as a processor 912, a CPU, a microprocessor, or an application processor (AP). The host device 910 may execute an operating system (OS) and/or various application programs. In some example embodiments, the system 900 may be included in a mobile device, and the host device 910 may be implemented by an AP. In some example embodiments, the host device 910 may be implemented by a system-on-a-chip (SoC), and accordingly, embedded in the system 900.

The processor 912 may include a CPU, a graphics processing unit (GPU), a neural processing unit (NPU), a digital signal processor (DSP), and the like, and the number of processors 912 may be one or more, that is, the processor 912 may be a multi-core processor. The processor 912 may be configured to execute commands executable by one or more machines, software, firmware, or segments of a combination thereof. Although FIG. 9 shows that the system 900 includes a single processor 912, the system 900 may include a plurality of processors according to some example embodiments.

The storage device 920 may include a memory controller 930 and an NVM 940. The memory controller 930 may perform a program operation, a read operation, and an erase operation on the NVM 940 according to requests from the host device 910. The NVM 940 may perform a write operation, a read operation, and an erase operation under control of the memory controller 930. The NVM 940 may include a plurality of NVM devices 941 respectively connected to a plurality of channels CH1 to CH4. The plurality of NVM devices 941 may be connected to the memory controller 930 through the plurality of channels CH1 to CH4. Although FIG. 9 shows that the number of channels is 4, and two NVM devices 941 are connected for each channel, the example embodiments are not limited thereto.

The memory controller 930 and the plurality of NVM devices 941 may correspond to the memory controller 120 and the NVM device 110 of FIG. 1, respectively. The memory controller 930 may include the host interface 121, the memory interface 122, the processor (or CPU) 123, the RAM 124, the MMU 125, and the ECC processing unit 126 described with reference to FIG. 1 and further include a serializer/deserializer (SERDES) interface 931.

The SERDES interface 931 may be provided according to an increase in an input/output throughput of the memory controller 930 connected to the plurality of NVM devices 941. The SERDES interface 931 may include a SERDES transmitter part, a SERDES receiver part, and a controller part. The SERDES transmitter part may include a parallel-to-serial circuit and a transmitter, receive a parallel data stream, and serialize the received parallel data stream. The SERDES receiver part may include a receiver, an amplifier, an equalizer, a clock and data reconstruction circuit, and a serial-to-parallel circuit, receive a serial data stream, and parallelize the received serial data stream. The controller part may include registers such as First In First Out (FIFO).

Figure 10:
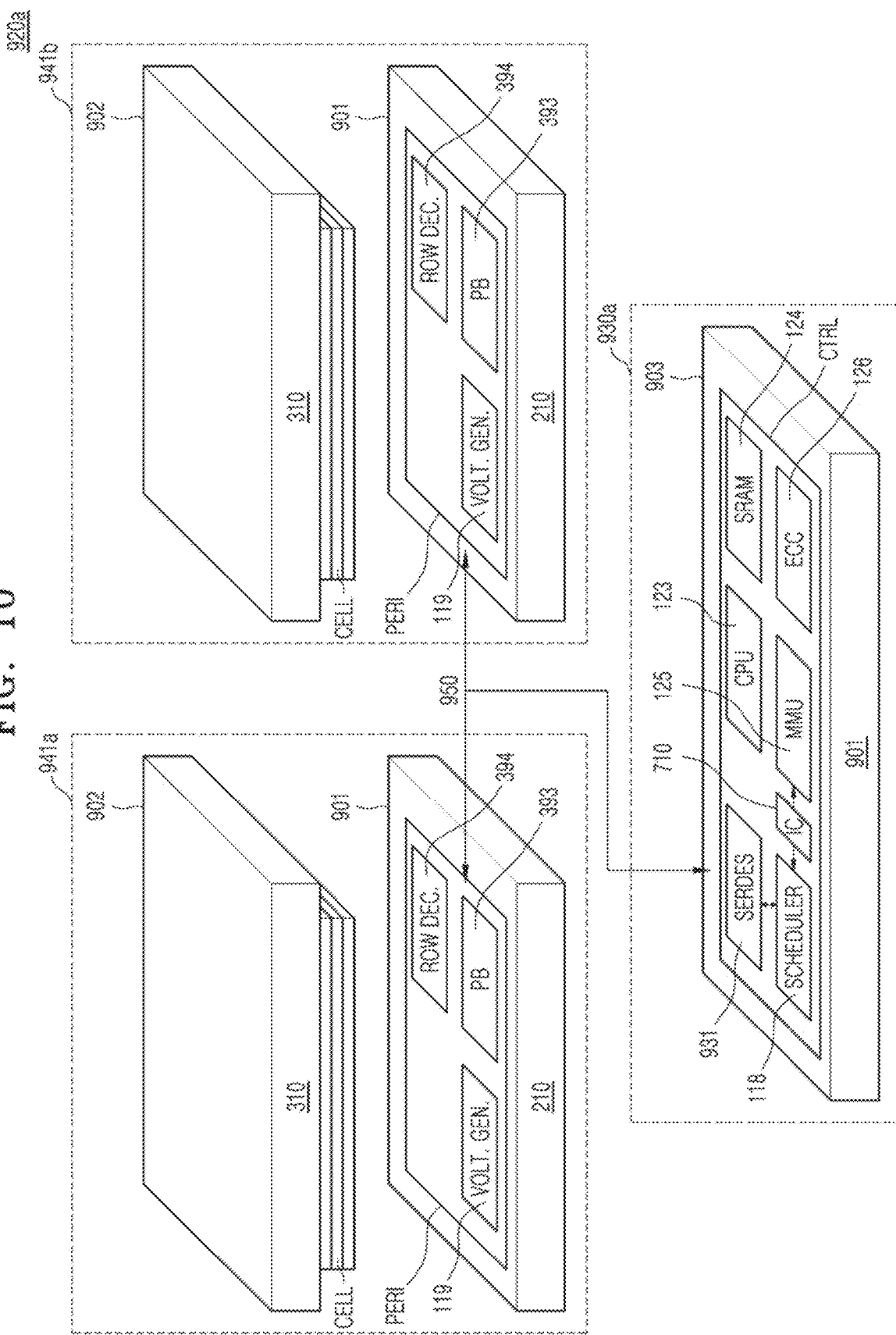
FIG. 10 is an example in which a storage device of FIG. 9 is implemented by 3D wafer-to-wafer bonding.

FIG. 10 is an example in which the system 900 of FIG. 9 is implemented by 3D wafer-to-wafer bonding. Compared with the storage device 100b of FIG. 7, a storage device 920a of FIG. 10 differs in that a plurality of NVM devices 941a and 941b are connected to a memory controller 930a.

Referring to FIGS. 9 and 10, the storage device 920a may include the plurality of NVM devices 941a and 941b and the memory controller 930a. Each of the plurality of NVM devices 941a and 941b may include a first chip 901 including the peripheral circuit region PERI formed on the first substrate 210, and a second chip 902 including the cell region CELL formed on the second substrate 310. In the peripheral circuit region PERI of the first chip 901, the voltage generator 119, the page buffer unit 393, and the row decoder 394 may be arranged.

The memory controller 930a may be implemented by a third chip 903 including the control circuit region CTRL formed on a first chip 901. In the control circuit region CTRL, the CPU 123, the SRAM 124, the MMU 125, the ECC processing unit 126, the scheduler 118, and the SERDES interface 931 may be arranged. The scheduler 118 may be arranged to be adjacent to the MMU 125 and control an operation of the plurality of NVM devices 941a and 941b based on code stored in the MMU 125.

The SERDES interface 931 may be connected to the plurality of NVM devices 941a and 941b through a conductive wire 950. The conductive wire 950 drawn for briefness of a drawing actually includes a plurality of conductive wires. The SERDES interface 931 may use the parallel-to-serial circuit and the transmitter when transmitting data to the plurality of NVM devices 941a and 941b, and use the serial-to-parallel circuit and the data reconstruction circuit when receiving data from the plurality of NVM devices 941a and 941b.

Figure 11:
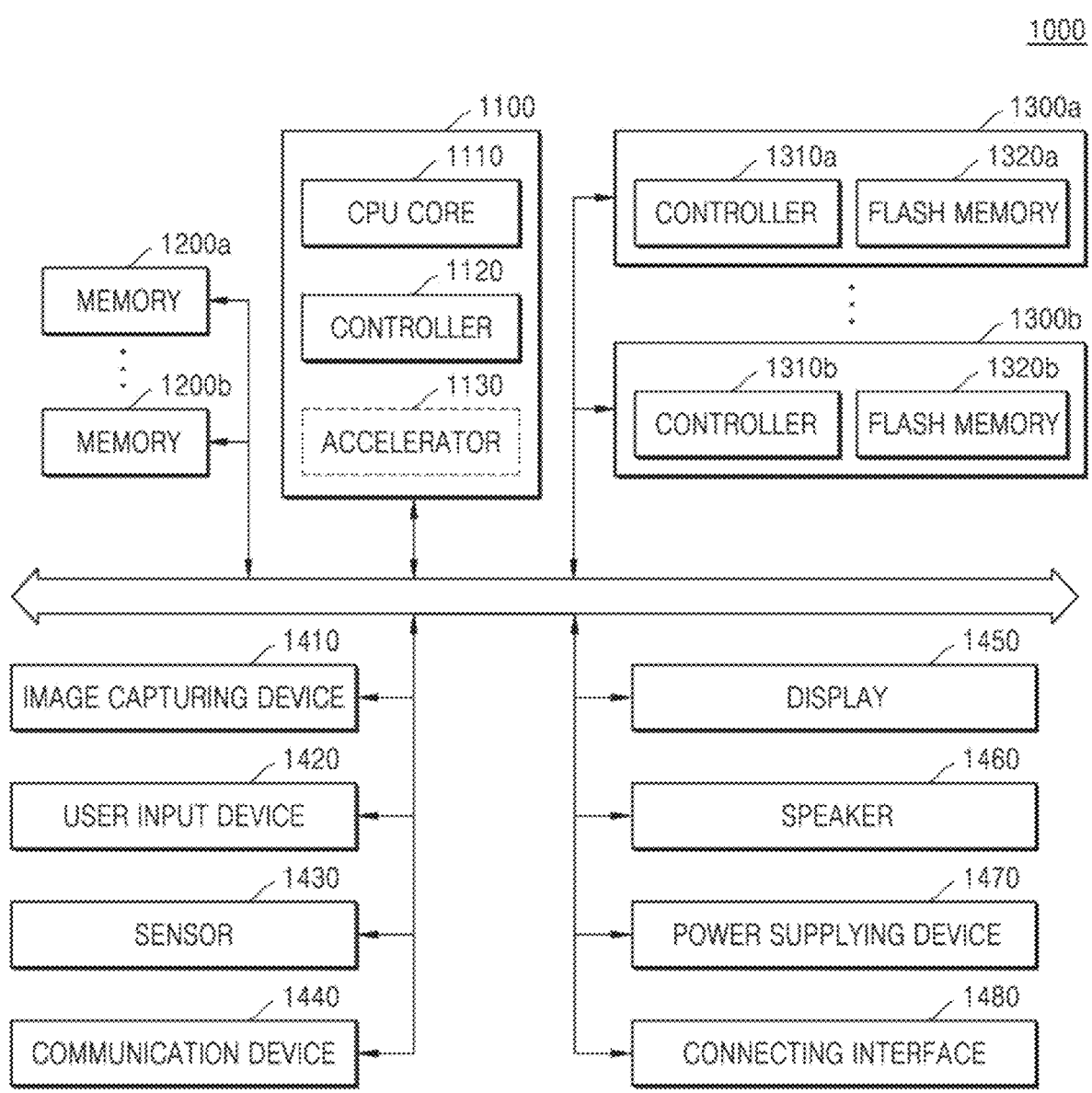
FIG. 11 is a block diagram illustrating a system to which a storage device according to some example embodiments of the inventive concepts are applied.

FIG. 11 is a block diagram illustrating a system 1000 to which a storage device according to some example embodiments of the inventive concepts are applied. The system 1000 of FIG. 11 may be basically a mobile system such as a portable communication terminal (mobile phone), a smartphone, a tablet PC, a wearable device, a healthcare device, or an Internet of Things (IOT) device. However, the system 1000 of FIG. 11 is not necessarily limited to the mobile system but may be a PC, a laptop computer, a server, a media player, an automotive device such as a navigation device, or the like.

Referring to FIG. 11, the system 1000 may include a main processor 1100, memories 1200a and 1200b, and storage devices 1300a and 1300b and further include one or more of an image capturing device 1410, a user input device 1420, a sensor 1430, a communication device 1440, a display 1450, a speaker 1460, a power supplying device 1470, and a connecting interface 1480.

The main processor 1100 may control a general operation of the system 1000, and more particularly, control operations of the other components constituting the system 1000. The main processor 1100 may be implemented by a general-purpose processor, an exclusive processor, an AP, or the like.

The main processor 1100 may include one or more CPU cores 1110 and further include a controller 1120 configured to control the memories 1200a and 1200b and/or the storage devices 1300a and 1300b. According to some example embodiments, the main processor 1100 may further include an accelerator block 1130 that is an exclusive circuit for high-speed data computation such as artificial intelligence (AI) data computation. The accelerator block 1130 may include a GPU, an NPU, a data processing unit (DPU), and/or the like and may be implemented by a separate chip physically independent to the other components in the main processor 1100.

The memories 1200a and 1200b may be used as a main memory device of the system 1000 and include volatile memories such as SRAM and/or DRAM or include NVMs such as PRAM and/or RRAM. The memories 1200a and 1200b may be implemented in the same package as the main processor 1100.

The storage devices 1300a and 1300b may function as a nonvolatile storage device storing data regardless of whether power is supplied thereto and have a relatively larger storage capacity than the memories 1200a and 1200b. The storage devices 1300a and 1300b may include memory controllers 1310a and 1310b and NVM devices 1320a and 1320b storing data under control of the memory controllers 1310a and 1310b. The NVM devices 1320a and 1320b may include a vertical NAND (V-NAND) flash memory of a two-dimensional (2D) or 3D structure or include other types of NVMs such as PRAM and/or RRAM.

The storage devices 1300a and 1300b may be included in the system 1000 by being physically separated from the main processor 1100 or be implemented in the same package as the main processor 1100. In addition, the storage devices 1300a and 1300b may have the same shape as a memory card so that the storage devices 1300a and 1300b are detachably coupled to the other components of the system 1000 through an interface such as the connecting interface 1480 to be described below. The storage devices 1300a and 1300b may be devices to which a standard regulation such as UFS is applied but are not necessarily limited thereto.

The storage devices 1300a and 1300b may correspond to the storage device 100 described with reference to FIGS. 1 to 10. In the NVM devices 1320a and 1320b, a first chip in which a peripheral circuit region including a control logic circuit configured to control operation modes of the NVM devices 1320a and 1320b is formed on a first surface of a first substrate is wafer-bonded with a second chip in which 3D arrays of NVM cells are formed on a first surface of a second substrate. The memory controllers 1310a and 1310b include a third chip in which a control circuit region including circuits configured to set and change operation conditions of the NVM devices 1320a and 1320b is formed. In the control circuit region of the third chip, a portion of a control logic circuit associated with the operation conditions of the NVM devices 1320a and 1320b is arranged, and the portion of the control logic circuit may include a SERDES interface configured to share RAM and transmit and receive data to and from the NVM devices 1320a and 1320b. According to some example embodiments, the control circuit region of the memory controllers 1310a and 1310b may be formed in the peripheral circuit region of the first chip.

The image capturing device 1410 may capture a still image or a video and include a camera, a camcorder, a webcam, and/or the like.

The user input device 1420 may receive various types of data input from a user of the system 1000 and include a touch pad, a keypad, a keyboard, a mouse, a microphone, and/or the like.

The sensor 1430 may sense various types of physical quantities acquirable from the outside of the system 1000 and covert the sensed physical quantities into electrical signals. The sensor 1430 may include a temperature sensor, a pressure sensor, an illuminance sensor, a position sensor, an acceleration sensor, a biosensor, a gyroscope, and/or the like.

The communication device 1440 may transmit and receive signals to and from other devices outside the system 1000 according to various communication protocols. The communication device 1440 may be implemented by including an antenna, a transceiver, a modem, and/or the like.

The display 1450 and the speaker 1460 may function as output devices configured to output visual information and auditory information to the user of the system 1000, respectively.

The power supplying device 1470 may properly convert power supplied from a battery (not shown) embedded in the system 1000 and/or an external power source and supply the converted power to each component in the system 1000.

The connecting interface 1480 may provide a connection between the system 1000 and an external device connected to the system 1000 to transmit and receive data to and from the system 1000. The connecting interface 1480 may be implemented by various interface schemes such as an ATA interface, a SATA interface, an e-SATA interface, a SCSI, a SAS, a PCI interface, a PCIe interface, an NVM express (NVMe) interface, an IEEE 1394 interface, a USB interface, an SD card interface, an MMC interface, an eMMC interface, a UFS interface, an embedded UFS (eUFS) interface, and a CF card interface.

Figure 12:
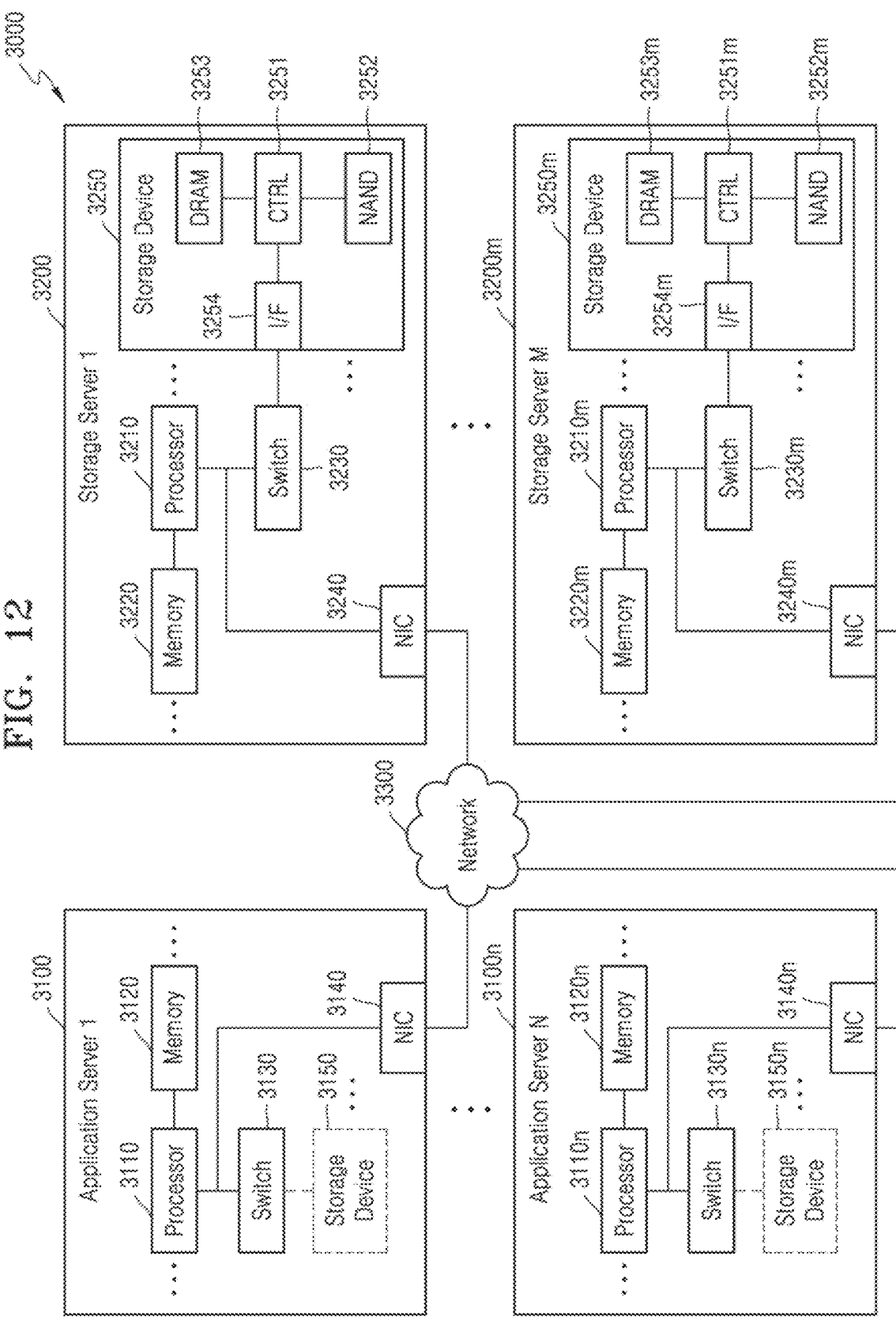
FIG. 12 is a block diagram illustrating a data center to which a storage device according to some example embodiments of the inventive concepts are applied.

FIG. 12 is a block diagram illustrating a data center 3000 to which a storage device according to some example embodiments of the inventive concepts are applied.

Referring to FIG. 12, the data center 3000 is a facility configured to collect various kinds of data and provide a service and may be referred as a data storage center. The data center 3000 may be a system for operating a search engine and a database or a computing system used by companies, such as banks, or government agencies. The data center 3000 may include application servers 3100 to 3100n and storage servers 3200 to 3200m. The number of the application servers 3100 to 3100n and the number of storage servers 3200 to 3200m may be variously selected according to some example embodiments, and the number of the application servers 3100 to 3100n may be different from the number of storage servers 3200 to 3200m.

The application server 3100 or the storage server 3200 may include at least one of processors 3110 and 3210 and memories 3120 and 3220. When the storage server 3200 is described as an example, the processor 3210 may control a general operation of the storage server 3200 and access the memory 3220 to execute an instruction and/or data loaded in the memory 3220. The memory 3220 may include double data rate synchronous DRAM (DDR SDRAM), a high bandwidth memory (HBM), a hybrid memory cube (HMC), a dual in-line memory module (DIMM), an Optane DIMM, or an NVMDIMM. According to some example embodiments, the number of processors 3210 and the number of memories 3220 included in the storage server 3200 may be variously selected. In some example embodiments, the processor 3210 and the memory 3220 may provide a processor-memory pair. In some example embodiments, the number of processors 3210 may be different from the number of memories 3220. The processor 3210 may include a single-core processor or a multi-core processor. The description made to the storage server 3200 may also be similarly applied to the application server 3100. According to some example embodiments, the application server 3100 may not include a storage device 3150. The storage server 3200 may include at least one storage device 3250. The number of storage devices 3250 included in the storage server 3200 may be variously selected according to some example embodiments.

The application servers 3100 to 3100*n* and the storage servers 3200 to 3200*m* may communicate with each other over a network 3300. The network 3300 may be implemented using Fibre Channel (FC), Ethernet, or the like. Herein, FC is a medium used for relatively high-speed data transmission and may use an optical switch providing high performance/high availability. According to access schemes of the network 3300, the storage servers 3200 to 3200*m* may be provided as a file storage, a block storage, or an object storage.

In some example embodiments, the network 3300 may be a storage exclusive network such as a storage area network (SAN). For example, the SAN may be an FC-SAN using an FC network and implemented according to an FC protocol (FCP). As another example, the SAN may be an Internet protocol (IP)-SAN using a transmission control protocol (TCP)/IP network and implemented according to a SCSI over TCP/IP or Internet SCSI (iSCSI) protocol. As another example, the network 3300 may be a general network such as a TCP/IP network. For example, the network 3300 may be implemented according to a protocol such as an FC over Ethernet (FCoE) protocol, a network attached storage (NAS) protocol, or an NVMe over fabrics (NVMe-oF) protocol.

Hereinafter, a description is made based on the application server 3100 and the storage server 3200. A description made to the application server 3100 may also be applied to another application server 3100*n*, and a description made to the storage server 3200 may also be applied to another storage server 3200*m*.

The application server 3100 may store data, requested to store by the user or a client, in one of the storage servers 3200 to 3200*m* over the network 3300. In addition, the application server 3100 may acquire data, required to read by the user or the client, from one of the storage servers 3200 to 3200*m* over the network 3300. For example, the application server 3100 may be implemented by a web server, a database management system (DBMS), or the like.

The application server 3100 may access a memory 3120*n* or a storage device 3150*n* included in the application server 3100*n* over the network 3300 or access one of memories 3220 to 3220*m* or one of storage devices 3250 to 3250*m* included in one of the storage servers 3200 to 3200*m* over the network 3300. Accordingly, the application server 3100 may perform various operations on data stored in the application servers 3100 to 3100*n* and/or the storage servers 3200 to 3200*m*. For example, the application server 3100 may execute an instruction for moving or copying data among the application servers 3100 to 3100*n* and/or the storage servers 3200 to 3200*m*. In this case, the data may be moved from the storage devices 3250 to 3250*m* in the storage servers 3200 to 3200*m* to memories 3120 to 3120*n* in the application servers 3100 to 3100*n* directly or through the memories 3220 to 3220*m* in the storage servers 3200 to 3200*m*. The data moved over the network 3300 may be encrypted data for security or privacy.

When the storage server 3200 is described as an example, an interface 3254 may provide a physical connection between the processor 3210 and a controller 3251 and a physical connection between a network interface card (NIC) 3240 and the controller 3251. For example, the interface 3254 may be implemented by a direct attached storage (DAS) scheme of directly accessing the storage device 3250 through an exclusive cable. In addition, for example, the interface 3254 may be implemented by various interface schemes such as an ATA interface, a SATA interface, an e-SATA interface, a SCSI, a SAS, a PCI interface, a PCIe interface, an NVMe interface, an IEEE 1394 interface, a USB interface, an SD card interface, an MMC interface, an eMMC interface, a UFS interface, an eUFS interface, and a CF card interface.

The storage server 3200 may further include a switch 3230 and the NIC 3240. The switch 3230 may selectively connect the processor 3210 to the storage device 3250 or selectively connect the NIC 3240 to the storage device 3250, under control of the processor 3210.

In some example embodiments, the NIC 3240 may include a network interface card, a network adaptor, or the like. The NIC 3240 may be connected to the network 3300 by a wired interface, a wireless interface, a Bluetooth interface, an optical interface, or the like. The NIC 3240 may include an internal memory, a DSP, a host bus interface, and the like and may be connected to the processor 3210, the switch 3230, and/or the like through the host bus interface. The host bus interface may be implemented by some of the example embodiments of the interface 3254 described above. In some example embodiments, the NIC 3240 may be integrated with at least one of the processor 3210, the switch 3230, and the storage device 3250.

Each of processors 3110 to 3110*n* and 3210 to 3210*m* in the application servers 3100 to 3100*n* and the storage servers 3200 to 3200*m* may program or read data by transmitting a command to one of storage devices 3150 to 3150*n* and 3250 to 3250*m* and memories 3120 to 3120*n* and 3220 to 3220*m*. In this case, the data may be data error-corrected by an ECC engine. The data may be data bus inversion (DBI)- or data masking (DM)-processed data and include cyclic redundancy code (CRC) information. The data may be encrypted data for security or privacy.

Each of the storage devices 3150 to 3150*n* and 3250 to 3250*m* may transmit a control signal and a command/an address signal to one of NAND flash memory devices 3252 to 3252*m* in response to a read command received from one of the processors 3110 to 3110*n* and 3210 to 3210*m*. Accordingly, when data is read from one of the NAND flash memory devices 3252, a read enable (RE) signal may be input as a data output control signal and function to output the data to a data queue (DQ) bus. A data strobe (DQS) may be generated by using the RE signal. The command and the address signal may be latched to a page buffer according to a leading edge or a trailing edge of a write enable (WE) signal.

The controller 3251 may generally control an operation of the storage device 3250. In some example embodiments, the controller 3251 may include SRAM. The controller 3251 may write data in the NAND flash memory device 3252 in response to a write command or read data from the NAND flash memory device 3252 in response to a read command. For example, the write command and/or the read command may be provided from the processor 3210 in the storage server 3200, the processor 3210m in the storage server 3200m, the processor 3110 in the application server 3100, or the processor 3110n in the application server 3100n. A DRAM 3253 may temporarily store (buffer) data to be written in the NAND flash memory device 3252 or data read from the NAND flash memory device 3252. In addition, the DRAM 3253 may store metadata. Herein, the metadata may be user data or data generated by the controller 3251 to manage the NAND flash memory device 3252. The storage device 3250 may include a secure element (SE) for security or privacy.

In a storage device according to some example embodiments of the inventive concepts, a first chip in which a peripheral circuit region including a control logic circuit configured to control operation modes of an NVM device is formed on a first surface of a first substrate is wafer-bonded with a second chip in which 3D arrays of NVM cells are formed on a first surface of a second substrate. A memory controller includes a third chip in which a control circuit region including circuits configured to set and change operation conditions of the NVM device is formed. In the control circuit region of the third chip, a portion of the control logic circuit associated with the operation conditions of the NVM device is arranged, and the portion of the control logic circuit may include a SERDES interface configured to share RAM in the memory controller and transmit and receive data to and from the NVM device. According to some example embodiments, the control circuit region of the memory controller may be formed in the peripheral circuit region of the first chip.

In a storage device according to some example embodiments of the inventive concepts, a first chip in which a peripheral circuit region including a control logic circuit configured to control operation modes of an NVM device is formed on a first surface of a first substrate is wafer-bonded with a second chip in which 3D arrays of NVM cells are formed on a first surface of a second substrate, and a scheduler that is a portion of the control logic circuit configured to control operation conditions of the NVM device is arranged on a second surface that is an opposite surface of the first surface of the second substrate. On the second surface of the second substrate of the second chip, at least one of circuits constituting the memory controller is arranged, or the whole circuits of the memory controller are arranged.

The storage device 100 (or other circuitry, for example, the memory device 110, memory controller 120, control logic circuit 114, memory cell array 116, host interface 121, memory interface 122, central processing unit (CPU) 123, RAM 124, memory management unit (MMU) 125, error correction code (ECC) processing unit 126, page buffer unit 393, scheduler 118, interconnector circuit 710, system 900, storage device 920a, system 1000, the further subcomponents as discussed herein, or other circuitry discussed herein) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to some example embodiments thereof, it will be understood that various changes in form and details may be made therein without departing from the spirit and scope of the following claims.

What is claimed is:
1. A storage device comprising:
a nonvolatile memory (NVM) device comprising NVM cells; and
a memory controller configured to control the NVM device,
wherein the NVM device comprises
a first chip including a peripheral circuit region comprising a first control logic circuit configured to control operation modes of the NVM device, the peripheral circuit region being on a first surface of a first substrate of the first chip; and
a second chip including three-dimensional (3D) arrays of the NVM cells, the 3D arrays being on a first surface of a second substrate of the second chip, and the second chip being vertically stacked on the first chip so that the first surface of the first substrate is bonded with the first surface of the second substrate, and
wherein the memory controller comprises
a third chip including a control circuit region comprising circuits configured to set and change operation conditions of the NVM device, the control circuit region being on a first surface of a third substrate of the third chip, and a second control logic circuit associated with the operation conditions of the NVM device being on the first surface of the third substrate of the third chip.
2. The storage device of claim 1, further comprising:
a processor configured to control an operation of the memory controller, in the control circuit region of the third chip; and
random access memory (RAM) comprising a working memory of the memory controller, in the control circuit region of the third chip,
wherein the second control logic circuit shares the RAM.
3. The storage device of claim 2, further comprising:
a memory management unit (MMU) in the control circuit region of the third chip and configured to change the operation conditions of the NVM device based on a deterioration state of the NVM device, the second control logic circuit being adjacent to and connected to the MMU.
4. The storage device of claim 3, wherein the MMU is configured to store deterioration information indicating the deterioration state of the NVM device, and the deterioration information includes one or more of a program/erase cycle, an erase count, a program count, a read count, a wear-level count, an elapse time, and an operation temperature.
5. The storage device of claim 4, wherein the MMU is configured to repeat generating training data based on the deterioration information of the NVM device and output a first operation condition of the NVM device based on the training data.
6. The storage device of claim 1, wherein the second control logic circuit includes a scheduler configured to control at least one of a voltage level, an application time point, an application time, and a number of application times of corresponding control signals according to an operation mode of the NVM device.
7. The storage device of claim 1, wherein, in the NVM device, a first bonding metal on a top metal layer of the first chip is electrically connected to a second bonding metal on a top metal layer of the second chip.

8. A storage device comprising:
a plurality of nonvolatile memory (NVM) devices each comprising NVM cells; and
a memory controller configured to control the plurality of NVM devices,
wherein each of the plurality of NVM devices comprises
a first chip including a peripheral circuit region comprising a first control logic circuit configured to control operation modes of a corresponding NVM device, the peripheral circuit region being on a first surface of a first substrate of the first chip; and
a second chip including three-dimensional (3D) arrays of the NVM cells, the 3D arrays being on a first surface of a second substrate of the second chip, and the second chip being vertically stacked on the first chip so that the first surface of the first substrate is bonded with the first surface of the second substrate, and
wherein the memory controller comprises a third chip including a control circuit region including circuits configured to set and change operation conditions of each of the plurality of NVM devices, the control circuit region being on a first surface of a third substrate of the third chip, the control circuit region comprises a serializer/deserializer (SERDES) interface configured to transmit and receive data to and from the plurality of NVM devices, and a second control logic circuit associated with the operation conditions of each of the plurality of NVM devices being on the first surface of the third substrate of the third chip.

9. The storage device of claim 8, wherein the second control logic circuit is adjacent to the SERDES interface.

10. The storage device of claim 9, wherein the SERDES interface comprises:
a parallel-to-serial circuit configured to serialize and transmit a parallel data stream from the memory controller to each of the plurality of NVM devices; and
a serial-to-parallel circuit configured to receive a serial data stream transmitted from each of the plurality of NVM devices, and parallelize the received serial data stream.

11. The storage device of claim 8, further comprising, in the control circuit region of the third chip:
a processor configured to control an operation of the memory controller; and
random access memory (RAM) comprising a working memory of the memory controller,
wherein the second control logic circuit shares the RAM.

12. The storage device of claim 11, further comprising, in the control circuit region of the third chip:
a memory management unit (MMU) configured to change operation conditions of a corresponding NVM device based on a deterioration state of each of the plurality of NVM devices, wherein the second control logic circuit is arranged to be adjacent to the MMU.

13. The storage device of claim 12, wherein the MMU is configured to store deterioration information indicating the deterioration states of the plurality of NVM devices, and the deterioration information includes one or more of a program/erase cycle, an erase count, a program count, a read count, a wear-level count, an elapse time, and an operation temperature.

14. The storage device of claim 13, wherein the MMU is configured to generate training data based on the deterioration information of each of the plurality of NVM devices and repeatedly output a first operation condition of the plurality of NVM devices by using the training data.

15. The storage device of claim 8, wherein the second control logic circuit includes a scheduler configured to control at least one of a voltage level, an application time point, an application time, and a number of application times of corresponding control signals according to an operation mode of each of the plurality of NVM devices.

16. The storage device of claim 8, wherein, in each of the plurality of NVM devices, a first bonding metal on a top metal layer of the first chip is electrically connected to a second bonding metal on a top metal layer of the second chip.

17. A storage device comprising:
a nonvolatile memory (NVM) device comprising NVM cells; and
a memory controller configured to control the NVM device,
wherein the NVM device comprises:
a first chip including
a peripheral circuit region comprising a control logic circuit configured to control operation modes of the NVM device, and
a control circuit region comprising a memory management unit (MMU) included in the memory controller and configured to set and change operation conditions of the NVM device, the peripheral circuit region and the control circuit region being on a first surface of a first substrate of the first chip; and
a second chip including three-dimensional (3D) arrays of the NVM cells, the 3D arrays are on a first surface of a second substrate of the second chip, and the second chip being vertically stacked on the first chip so that the first surface of the first substrate is bonded with the first surface of the second substrate, and
wherein the control logic circuit is adjacent to the MMU and is connected to the MMU.

18. The storage device of claim 17, further comprising, in the peripheral circuit region of the first chip:
a row decoder connected to word lines of the NVM cells; and
a page buffer connected to bit lines of the NVM cells,
wherein the row decoder and the page buffer are in edge areas of the first substrate of the first chip, and the control circuit region is at an inner side of the edge areas of the first substrate of the first chip.

19. The storage device of claim 18, further comprising, in the control circuit region of the first chip:
a processor configured to control an operation of the memory controller; and
random access memory (RAM) comprising a working memory of the memory controller,
wherein the control logic circuit shares the RAM.

20. The storage device of claim 18, further comprising, in the control circuit region of the first chip:
an error correction code (ECC) processing unit configured to detect and correct an error of data transmitted between the NVM device and the memory controller,
wherein, on the first substrate of the first chip, the page buffer is adjacent to the ECC processing unit.

* * * * *